(12) United States Patent
Simizu et al.

(10) Patent No.: US 6,445,201 B1
(45) Date of Patent: Sep. 3, 2002

(54) IC PACKAGE TESTING DEVICE AND METHOD FOR TESTING IC PACKAGE USING THE SAME

(75) Inventors: Jun Simizu; Akio Horimoto, both of Shiga (JP)

(73) Assignee: NEC Machinery Corporation, Kusatsu (JP)

( * ) Notice: Subject to any disclaimer, the term of this patent is extended or adjusted under 35 U.S.C. 154(b) by 50 days.

(21) Appl. No.: 09/638,891

(22) Filed: Aug. 16, 2000

(30) Foreign Application Priority Data

Aug. 17, 1999 (JP) .......................................... 11-230237

(51) Int. Cl.[7] .............................................. G01R 31/02
(52) U.S. Cl. ...................................... 324/758; 324/765
(58) Field of Search ................................. 324/758, 765, 324/754, 755; 348/87, 94, 95; 228/105; 356/400; 382/151

(56) References Cited

U.S. PATENT DOCUMENTS

| | | | | |
|---|---|---|---|---|
| 4,899,921 A | * | 2/1990 | Bendat et al. .............. | 228/105 |
| 5,416,592 A | * | 5/1995 | Mori et al. .................. | 356/400 |
| 5,815,000 A | * | 9/1998 | Farnworth et al. .......... | 324/758 |
| 5,903,662 A | * | 5/1999 | DeCarlo ..................... | 382/151 |
| 5,943,089 A | * | 8/1999 | Douglas ...................... | 348/95 |
| 6,048,750 A | * | 4/2000 | Hembree ..................... | 438/15 |
| 6,193,132 B1 | * | 2/2001 | Shibata et al. .............. | 228/105 |
| 6,246,789 B1 | * | 6/2001 | Hosotani et al. ............ | 382/151 |

* cited by examiner

Primary Examiner—Ernest Karlsen
(74) Attorney, Agent, or Firm—McGinn & Gibb, PLLC

(57) ABSTRACT

Coordinate data for the array pattern of contact pins and coordinate data for the array pattern of solder balls of an IC package is stored by a positioning section of an IC package testing device. The position of a BGA is adjusted so that the contact pins and the solder balls accurately overlap each other. The solder balls of the IC package are abutted on the respective contact pins while the IC package is sucked onto by a suction head. Then, the solder balls are abutted on the respective contact pins with an optimal load while measuring a load applied to the IC package by load cells.

20 Claims, 14 Drawing Sheets

X-Y COORDINATE AXES OF CAMERA (FIXED POINT α)

IC PACKAGE TESTING DEVICE AND METHOD FOR TESTING IC PACKAGE USING THE SAME

BACKGROUND OF THE INVENTION

1. Field of the Invention

The present invention relates to an IC package testing device for evaluating electrical characteristics of an IC package, particularly BGA (ball grid array), and a method for testing an IC package using the testing device. More particularly, the present invention relates to a handling device and a handling method for properly abutting solder balls of an IC package respectively on a plurality of measurement contact pins provided in a socket in the testing device.

1. Description of the Related Art

In recent years, as the number of pins provided in an IC package increases, BGA has been used more widely. First, a general structure of a BGA will be described. FIG. 1A is a side view of a BGA, and FIG. 1B is a plan view thereof. The BGA 1 is a semiconductor component having a rectangular shape. The BGA 1 is about 5 to 50 mm long along each side and about 0.5 to 3 mm thick. A plurality of solder balls 2 are provided on one surface of the BGA 1. An LSI (large-scale integrated circuit) 3 is buried in the central part of the BGA 1. Each electrode (not shown) of the LSI 3 is connected to a respective one of the solder balls 2 via a respective one of thin lines (not shown) running through the inside of the BGA 1. As a method for mounting the BGA 1 on a printed board (not shown), the surface of the BGA 1 having the solder balls 2 provided thereon is placed on the printed board and the solder balls 2 are melted so that the BGA 1 is integrated into the printed board as a circuit.

As shown in FIG. 1B, the BGA 1 includes a number of solder balls 2 arranged in a grid pattern which extends along the periphery thereof. Each solder ball 2 has a generally hemispherical shape and protrudes from the surface of the BGA 1. Each of the solder balls 2 has a diameter as small as about 0.3 mm. Recently, a single BGA 1 has some hundreds to one thousand or more of the solder balls 2, with a pitch of grid as small as about 0.5 mm. Recently, the degree of integration of an LSI has been increased. Along with that, the number of the solder balls 2 needs to be further increased. Meanwhile, a high-density mounting onto the printed board is also demanded. Therefore, it is difficult to increase the size of the BGA 1 itself. Thus, the density of the array of the solder balls 2 tends to be further increased.

Next, a method for measuring electrical characteristics of the BGA 1 will be described. FIG. 2A through FIG. 2D are cross-sectional views sequentially illustrating the steps of a method for testing electrical characteristics of the BGA 1 using a conventional socket 4p. In general, a jig (hereinafter, referred to as a socket) including a group of contact pins 5p having an array identical to that of the solder balls 2 is used for the measurement. The contact pins 5p can be compressed and expanded by a certain amount. When compressed and expanded, a predetermined spring pressure is applied to the point of contact. As the solder balls 2 are pressed against the tips of the contact pins 5p, the contact pins 5p are electrically connected to the solder balls 2, thereby making it possible to measure various kinds of electrical characteristics of the BGA 1. The contact pins 5p shown in FIG. 2A are, for example, of a type which includes a compression spring (not shown) under each pin, and generates a spring pressure according to the amount of compression thereof.

The steps of the method for measuring electrical characteristics of the BGA 1 will be sequentially described below.

First, the BGA 1 is positioned with respect to the socket 4p based on the outer shape of the BGA 1 as shown in FIG. 1B. Thereafter, a suction head 6p sucks onto a surface of the BGA 1 which is opposite to the surface including the solder balls 2, and carries the BGA 1 over the socket 4p.

Next, as shown in FIG. 2A, the suction head 6p inserts the BGA 1 into the socket 4p. The socket 4p includes many contact pins 5p on the bottom. Each side wall of the socket 4p is formed of two portions, i.e., a tapered section 40 and a straight section 41. The tapered section 40 adjoins the opening of the socket 4p. The side wall of the tapered section 40 is tapered such that it flares upwardly. If the BGA 1 has a square shape as shown in FIG. 1B, the side wall of the tapered section 40 has four tapered sides. The straight section 41 adjoins the bottom of the socket 4p, and has a vertical side wall.

Next, after the suction head 6p carries the BGA 1 to the tapered section 40, suction is ceased so as to release and drop the BGA 1 off from the suction head 6p as shown in FIG. 2B. Then, BGA 1 slides down along the tapered surfaces of the tapered section 40 and into the straight section 41.

As shown in FIG. 2C, each of the solder balls 2 is loaded on a respective one of the contact pins 5p at the bottom of the socket 4p, and the falling down of the BGA 1 is stopped. The shape of the straight section 41 is set to be slightly larger than the outer shape of the BGA 1, thereby making it possible to abut the BGA 1 on the respective contact pins 5p based on the outer shape of the BGA 1.

Next, as shown in FIG. 2D, the suction head 6p is lowered by a predetermined amount so as to press the BGA 1. As a result, the contact pins 5p are pressed down by a certain amount via the BGA 1. Consequently, each of the contact pins 5p is electrically connected to a respective one of the solder balls 2. Thus, using a measuring instrument (not shown) which is connected to each of the contact pins 5p via a cable or the like (not shown), various kinds of electrical characteristics are measured. After the measurement, the suction head 6p is raised while sucking onto the BGA 1 again, and carries the BGA 1 to a predetermined position for the next step to be performed.

However, the conventional IC package testing device and testing method have problems as follows. First of all, the socket has a structural problem. As described above, when the BGA 1 slides down along the tapered section 40 in the opening of the socket 4p, the BGA 1 does not always slides down smoothly. Sometimes, the BGA 1 is stuck halfway through. FIG. 3A is a cross-sectional view showing a case where the BGA 1 is stuck halfway through the tapered section 40. The suction head 6p carries the BGA 1 to a predetermined position within the opening of the socket 4p, and then the suction is ceased so as to drop the BGA 1. However, while the BGA 1 is sliding down off from the suction-head 6p, a part of the BGA 1 is stuck in the tapered section 40, thereby preventing the BGA 1 from properly falling down from the suction head 6p. As shown in FIG. 3B, however, the suction head 6p is lowered by a predetermined amount even in such a state, whereby an excessive amount of external force is applied to the BGA 1 from above, damaging the BGA 1.

Moreover, the force applied by the suction head 6p is also applied to the contact pins 5p. This force is applied not only in the direction along which the contact pins 5p are compressed and expanded (i.e., the vertical direction) but also in the lateral direction. As described above, each of the contact pins 5p can be compressed and expanded due to the compression spring included therein. However, the maximum spring pressure during its compression and expansion is as small as about 10 g, and the size of the tip portion of the contact pin 5p is as small as about φ0.3 mm which is about the same as that of the solder ball 2. Thus, the contact pin 5p is a component which is extremely thin and fragile. As a result, when an external force in the lateral direction is applied thereto, the contact pin 5p is easily bent. If even only one contact pin 5p among many is bent and thus can no longer be compressed and expanded smoothly. As a result, the remaining contact pins 5p cannot abut on the solder balls 2, making it impossible to measure the electrical characteristics at all.

Furthermore, even when the BGA 1 successfully slides down the opening of the socket 4p, the solder balls 2 do not always abut on the contact pins 5p in an aligned manner. This is a problem arising from the manufacture of the BGA 1. In particular, although the solder balls 2 are arranged in a grid pattern having a constant pitch, the solder balls 2 are not manufactured based on the outer shape of the BGA 1. Therefore, the array of the solder balls 2 with respect to the outer shape of the BGA 1 often varies from a BGA to another.

FIG. 4A is a side view of a BGA 1e in which the solder balls 2 are out of alignment with respect to the outer shape of the BGA 1e, and FIG. 4B is a plan view thereof. In such a case, the solder balls 2 abut on the respective contact pins 5p while their central axes are out of alignment with each other.

Therefore, when the suction head 6p is lowered by a predetermined amount, a force in the lateral direction is applied to the solder balls 2 via the BGA 1e. As a result, the solder balls 2 may be stripped off from the BGA 1e. Moreover, since this is a lateral a direction force also for the contact pins 5p, the contact pins 5p may be damaged, thereby preventing them from being smoothly compressed and expanded.

When such a defect occurs in a contact pin, the contact pin needs to be replaced. As described above, however, the contact pin is a minute and fragile component. Also, precise positioning is required when attaching the contact pins, and it is also necessary to ensure that all the contact pins are uniformly compressed and expanded. Therefore, such a replacing operation is very difficult to perform, and it is practically impossible for a measurer to replace the defective contact pin by himself/herself. Therefore, conventionally, the entire socket has been replaced. As described above, since the socket is a very expensive component because of its special and precise structure, the replacement of the socket incurs a very high cost. Thus, in a conventional testing device for evaluating electrical characteristics of an IC package such as a BGA, a contact pin thereof is damaged every time the BGA is stuck in the socket section or out-of-alignment occurs between the solder balls and the contact pins, frequently causing the need for replacing the socket. As a result, the running const of this testing device is very expensive.

Furthermore, according to the conventional testing device and the conventional testing method, an electrical resistance between the contact pin and the solder ball becomes unstable. Electrical contact between the contact pin and the solder ball in the measurement of electrical characteristics will be described below. The tip of the contact pin is sharpened like the tip of a needle. The tip of the contact pin abuts on the solder ball, thereby applying a certain level of pressing pressure thereto. As a result, an oxide film formed on the surface of the solder ball is torn, thereby electrically connecting the contact pin to the solder ball. There exist many types of contact pins, for example, a contact pin having a single sharpened tip portion, a contact pin having a plurality of sharpened tip portions, and a contact pin with a tip formed by firmly bundling a number of thin metal wires and cutting the bundled metal wires in a direction perpendicular to the metal wires, with the cut face being used as the tip of the contact pin. The tip of the contact pin formed by bundling the metal wires appears to be flat.

A preferred contacting state between the contact pin and the solder ball is a state where the pressing pressure applied to the contact pin and the solder ball is minimum while the electrical resistance at the point of contact therebetween is minimum. If the pressing pressure applied by the suction head is so weak that the contact pin cannot tear the oxide film on the surface of the solder ball 2, the electrical resistance at the point of contact becomes large, failing to obtain normal measurement values. On the contrary, an excessive pressing pressure is meaningless for measurement because the electrical resistance at the point of contact cannot be smaller than a certain value. By repeating measurement with such an excessive pressing pressure, the contact pin is mechanically damaged in a repeated manner, thereby causing an adverse influence which reduces the lifetime of the fragile contact pin. Therefore, an ideal contacting state is a state in which the pressing pressure is minimum while the contact resistance is minimum, i.e., the state in which the amount of compression of the contact pin is minimum while the contact pin abuts on the solder ball after the oxide film on the surface of the solder ball is torn by the contact pin.

However, according to the conventional testing method, as shown in FIG. 2D, the BGA 1 mounted on the contact pins 5p is pushed down by a certain amount using the suction head 6p placed on the BGA 1. When the suction head 6p is lowered and then stopped, the position of the tip of the suction head 6p is always the same regardless of the thickness of the BGA 1. The thickness of a BGA is generally in a range of about 0.5 to about 3 mm. However, even among the same kind of BGAs, the thicknesses thereof often vary for different manufacturing lots. For example, the thickness of products whose standard thickness is 1 mm may sometimes vary by as much as 0.3 mm. Therefore, according to the conventional method in which the suction head 6p is lowered until it reaches a certain height for any BGA to be measured, the amount of compression of the contact pins 5p varies for various BGAs. In an extreme case, the contact pin 5p may not be compressed at all. Thus, according to the conventional measurement method, it is impossible to absorb the variation in the thickness among BGAs and to make the contact pins 5p respectively abut on the solder balls 2 with a uniform and optimal pressing pressure regardless of the thickness of the BGA.

SUMMARY OF THE INVENTION

An object of the present invention is to provide an IC package testing device and a method for testing an IC package using such an IC package testing device in which: an IC package is not stuck in a socket section, thereby always making solder balls of the IC package respectively abut on contact pins in the socket section in an aligned manner; and the solder balls are respectively abutted on the contact pins with an optimal load regardless of the thickness of the IC package, thereby making it possible to extend the lifetime of the contact pins and to measure electrical characteristics of the IC package in a highly accurate and highly efficient manner.

An IC package testing device according to the present invention comprises: a measuring unit having a socket including contact pins which contact on solder balls in an IC package for measuring electrical characteristics of the IC package; a camera unit for imaging a positional pattern of the solder balls in the IC package; an image recognition unit which recognizes an image obtained by the camera unit, processes the image, and obtains a positional pattern data of the solder balls; a first memory unit for storing the pattern data of the solder balls; a second memory unit for storing a positional pattern data of the contact pins in the socket; an adjusting unit for adjusting a position of the IC package so as to align the positional pattern of the solder balls with the positional pattern of the contact pins at a positioning section; and a carrier unit for holding the IC package which has been adjusted the position thereof at the positioning section, and carrying it to the socket and contacting the solder balls on the contact pins while holding the IC package.

According to the present invention, the position of the IC package is adjusted using the adjusting unit in association with the positions of the solder balls in the IC package and the positions of the contact pins in the socket. As a result, the positions of the solder balls can be accurately controlled, thereby making it possible to abut the solder balls on the contact pins in an aligned manner. Furthermore, the solder balls are respectively abutted on the contact pins while the carrier unit is holding the IC package, thereby preventing the IC package from being stuck.

The IC package testing device of the present invention may comprise: a plurality of pilot pins which are provided in the socket and have a fixed positional relationship with the contact pins; a socket calibration jig including a plurality of pilot holes which are fitted around the pilot pins and a plurality of image recognition marks which have a fixed positional relationship with the pilot holes; another camera unit for imaging the image recognition marks; and another image recognition unit which recognizes an image obtained by the camera unit, processes the image, and obtains a positional data of the image recognition marks and the positional pattern data of the contact pins; wherein said second memory unit stores the positional pattern data of the contact pins.

The IC package testing device of the present invention may comprises: a plurality of pilot pins which are provided in the socket and have a fixed positional relationship with the contact pins; and a socket calibration jig including a plurality of pilot holes which are fitted around the pilot pins and a plurality of image recognition marks which have a fixed positional relationship with the pilot holes; wherein said camera unit images the image recognition marks, said image recognition unit recognizes an image of the image recognition marks, processes the image, and obtains a positional data of the image recognition marks and the positional pattern data of the contact pins, and said second memory unit stores the positional pattern data of the contact pins.

Said adjusting unit may include a chuck unit which transfers the IC package along the X-axis and the Y-axis and rotates the IC package in a horizontal plane.

A difference between an inner diameter of each of the pilot holes and an outer diameter of each of the pilot pins may be equal to or less than 0.01 mm.

The unit for holding the IC package in the carrier unit may comprises a suction device including a suction surface for sucking onto the IC package.

The carrier unit may comprises: a motor for raising and lowering the IC package; and a load cell for measuring a load on the IC package, wherein an operation of the motor is controlled in association with the load on the IC package which is measured by the load cell. In this case, a plurality of the load cells may be disposed on the same plate provided parallel to the suction surface.

Thus, the load applied upon abutting the solder balls respectively on the contact pins can be constantly and optimally controlled, thereby minimizing the electrical resistance at the point of contact and improving the accuracy of the measurement for the electrical characteristics of the IC package.

A method for testing an IC package according the present invention comprises: imaging and recognizing a positional pattern of the solder balls in the IC package, storing said positional pattern data of the solder balls in the IC package; storing a positional pattern data of the contact pins in the socket; adjusting a position of the IC package so as to align the positional pattern of the solder balls with the positional pattern of the contact pins at a positioning section; carrying the IC package to the socket and contacts the solder balls to the contact pins by a carrier unit; and measuring electrical characteristics of the IC package after contacting the solder balls on the contact pins while holding the IC package by the carrier unit.

The nature, principle, and utility of the invention will become more apparent from the following detailed description when read in conjunction with the accompanying drawings in which like parts are designated by like reference numerals.

DETAILED DESCRIPTION OF THE PREFERRED EMBODIMENTS

Figure 5A:
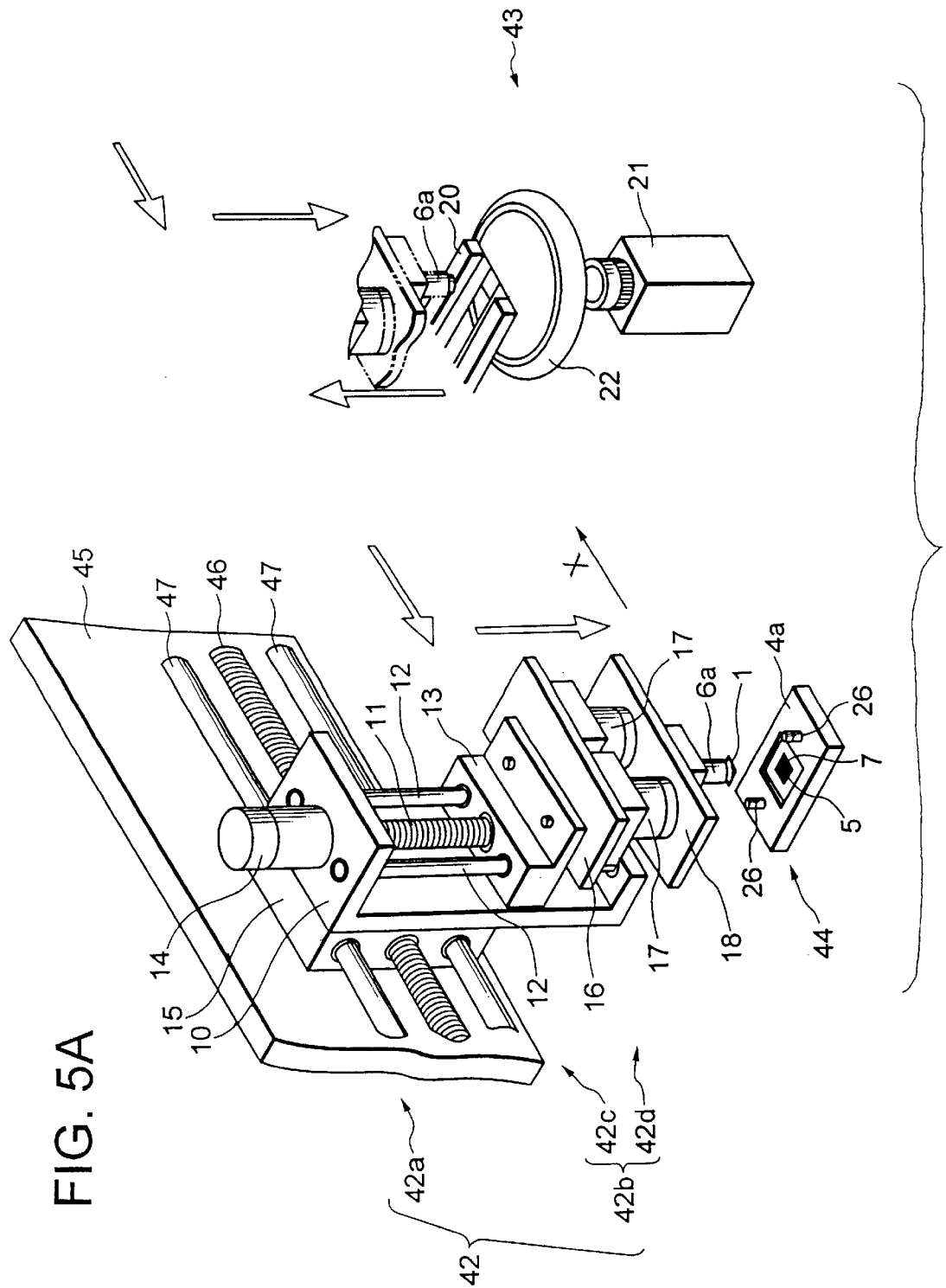
FIG. 5A is a perspective view illustrating the structure of a carrier arm section, that of a socket section and that of a positioning section in an IC package testing device according to the first embodiment of the present invention.
Figure 5B:
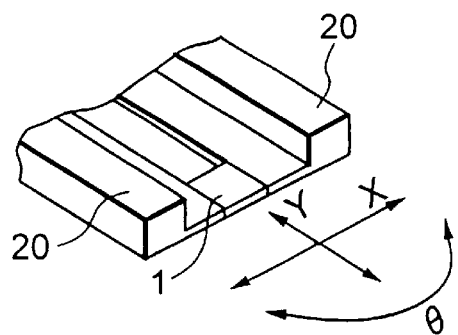
FIG. 5B is an enlarged view illustrating chucks shown in FIG. 5A.

The preferred embodiments of the present invention will now be described specifically with reference to the accompanying drawings. First, the structure of an IC package testing device according to the first embodiment of the present invention will be described. FIG. 5A is a perspective view illustrating the IC package testing device of the first embodiment of the present invention. FIG. 5A is a perspective view illustrating a carrier arm section 42, a socket section 44 and a positioning section 43. FIG. 5B is an enlarged view of chucks 20 shown in FIG. 5A.

The IC package testing device shown in FIG. 5A and FIG. 5B comprises: the socket section 44 for measuring electrical characteristics of a BGA 1; the positioning section 43 for positioning the BGA 1 so that soldering balls 2 of the BGA 1 abut on contact pins 5 in an aligned manner in the socket section 44; a socket calibration jig 30 (not shown) for measuring the positions of the contact pins 5 in the socket section 44; and the carrier arm section 42 for sucking onto and holding the BGA 1 and the socket calibration jig 30, for carrying the BGA 1 and the socket calibration jig 30 between the socket section 44 and the positioning section 43, and for making the BGA 1 abut on the contact pins 5 in the socket section 44. Each of the carrier arm section 42, the positioning section 43, and the socket section 44 is secured to a predetermined position in the device. The socket calibration jig 30 is not secured to the device and carried between the positioning section 43 and the socket section 44 by the carrier arm section 42. The BGA 1 to be tested is carried from the positioning section 43 to the socket section 44 by the carrier arm section 42.

As shown in FIG. 5A, the carrier arm section 42 includes a fixed section 42a and a horizontally movable section 42b which can move in a horizontal direction along the fixed section 42a. A base plate 45 which extends horizontally from a position above the socket section 44 to a position above the positioning section 43 is provided in the fixed section 42a.

A ball screw 46 for moving the horizontally movable section 42b in the horizontal direction is rotatably attached to the base plate 45 along the horizontal direction. Two rails 47 are disposed on respective sides of the ball screw 46 so as to be parallel to the ball screw 46. The ball screw 46 is connected to a motor (not shown) and rotated by the motor. Hereinafter, the horizontal direction along the ball screw 46 and the rails 47 is referred to as an X-axis direction.

The horizontally movable section 42b includes a vertically fixed section 42c which is movable in the horizontal direction (i.e., X-axis direction) and fixed in the vertical direction; and a movable section 42d which is connected to the vertically fixed section 42c and movable in the vertical direction. The movable section 42d can move in the vertical direction and the horizontal direction (X-axis direction) due to the fixed section 42a and the vertically fixed section 42c in the horizontally movable section 42b.

A horizontal motion nut section 15 is provided in the vertical fixed section 42c. The ball screw 46 and the rails 47 pass through the horizontal motion nut section 15, and the horizontal motion nut section 15 can move along the rails 47 in the X-axis direction along with the rotation of the ball screw 46. A C-shaped base plate 10 for holding the movable section 42d is connected to the horizontal motion nut section 15. Inside the C-shaped base plate 10, a ball screw 11 for moving the movable section 42d in the vertical direction is attached along the vertical direction. The both ends of the ball screw 11 are fitted into bearings (not shown) which are inserted in the C-shaped base plate 10. As a result, the ball screw 11 can rotate. The ball screw 11 is connected to a rotation axis (not shown) of a motor 14 for rotating the ball screw 11, which is secured onto the C-shaped base plate 10. The ball screw 11 rotates by the driving of the motor 14. Two rails 12 are disposed on respective sides of the ball screw 11 so as to be parallel to the ball screw 11.

A vertical motion nut section 13 is provided in the movable section 42d. The ball screw 11 and the rails 12 pass through the vertical motion nut section 13, and the vertical motion nut section 13 can move along the rails 12 in the vertical direction along with the rotation of the motor 14 and the ball screw 11. Since two rails 12 are provided on respective sides of the ball screw 11, the vertical motion nut section 13 can move in the vertical direction without rotating or jouncing. A load cell base plate 16 for securing load cells 17, two load cells 17 for measuring a load applied to the BGA 1, and a connecting plate 18 for connecting the two load cells 17 are attached below the vertical motion nut section 13 in a descending order. The two load cells 17 are interposed between the load cell base plate 16 and the connecting plate 18 and arranged in parallel. A suction head 6a for sucking onto the BGA 1 is attached to the lower surface of the connecting plate 18, and a suction surface of the suction head 6a is the bottom surface of the carrier arm section 42. All of the load cell base plate 16, the connecting plate 18, and the suction surface of the suction head 6a are horizontally disposed.

A transmission cable (not shown) for transmitting an electric signal which is outputted based on the load measured by the load cells 17 to a control section (not shown) is connected to the load cells 17. An air tube (not shown) for air suction is connected to the suction head 6a. The carrier arm section shown in FIG. 5A includes two load cells 17 and one suction head 6a. The suction head 6a is secured to the movable section 42d of the carrier arm section 42, and cannot be transfered in the X-axis and Y-axis directions or rotated with respect to the movable section 42d. Accordingly, the suction head 6a always moves together with the movable section 42d.

The control section (not shown) is provided for controlling the operation of the motor 14. Since an output signal from the load cells 17 is inputted to the control section and an output signal from the control section is inputted to the motor 14, the control section can control the motor 14 based on the output signal from the load cells 17. For example, the movable section 42d of the carrier arm section 42 is lowered to a certain height at a constant high speed, and thereafter lowered while checking the output signal from the load cells 17 so as to be able to stop the lowering when a preset signal voltage, i.e., a desired load, is obtained.

The positioning section 43 will now be described. As shown in FIG. 5A and FIG. 5B, the positioning section 43 includes the chucks 20, a camera 21, an illumination device 22, a chuck controlling section (not shown), an image recognition section (not shown), and a memory section (not shown). Two chucks 20 for adjusting the position of the BGA 1 are provided in the positioning section 43. The chucks 20 can be moved laterally (in the X-axis direction) to be opened and closed, and can move the BGA 1 in the X-axis and Y-axis directions or rotate the BGA 1 in a horizontal plane based on a signal from the chuck controlling section while holding the BGA 1. The camera 21 is disposed below the chucks 20, and can image the array pattern of the solder balls 2 of the chucked BGA 1 and image recognition marks of the socket calibration jig 30 (not shown). The camera 21 does not move, and is secured to a predetermined position of the device. An image processing of the array pattern of the solder balls 2 is performed in the image recognition section, and the image-processed array pattern is extracted as coordinate data on the X-Y coordinate system of the camera 21. The coordinate data is stored in the memory section.

The ring-shaped illumination device 22 is provided between the chucks 20 and the camera 21. In order to perform imaging and image recognition, an object generally needs to be illuminated. In order to image the BGA 1 and accurately perform the image recognition of the array pattern of the solder balls 2 of the BGA 1, it is necessary to illuminate the entire area of the surface of the BGA 1 where the solder balls 2 are provided with a uniform illumination and without being influenced by various background colors. In order to do so, it is desirable to dispose a plurality of LEDs (light-emitting diode) so as to surround the BGA 1 and to direct these respective illuminations toward the BGA 1. The ring-shaped illumination device 22 as shown in FIG. 5A has such a structure.

Figure 1A:
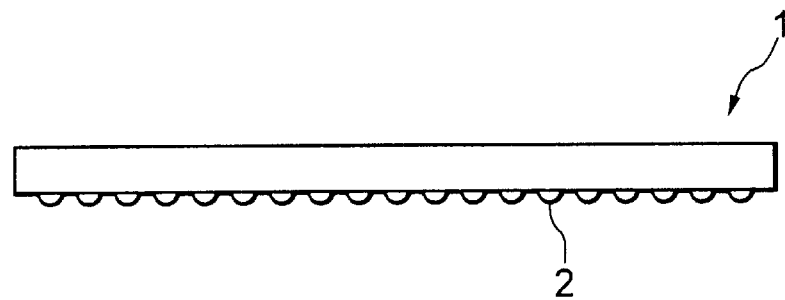
FIG. 1A is a side view showing a BGA structure.
Figure 1B:
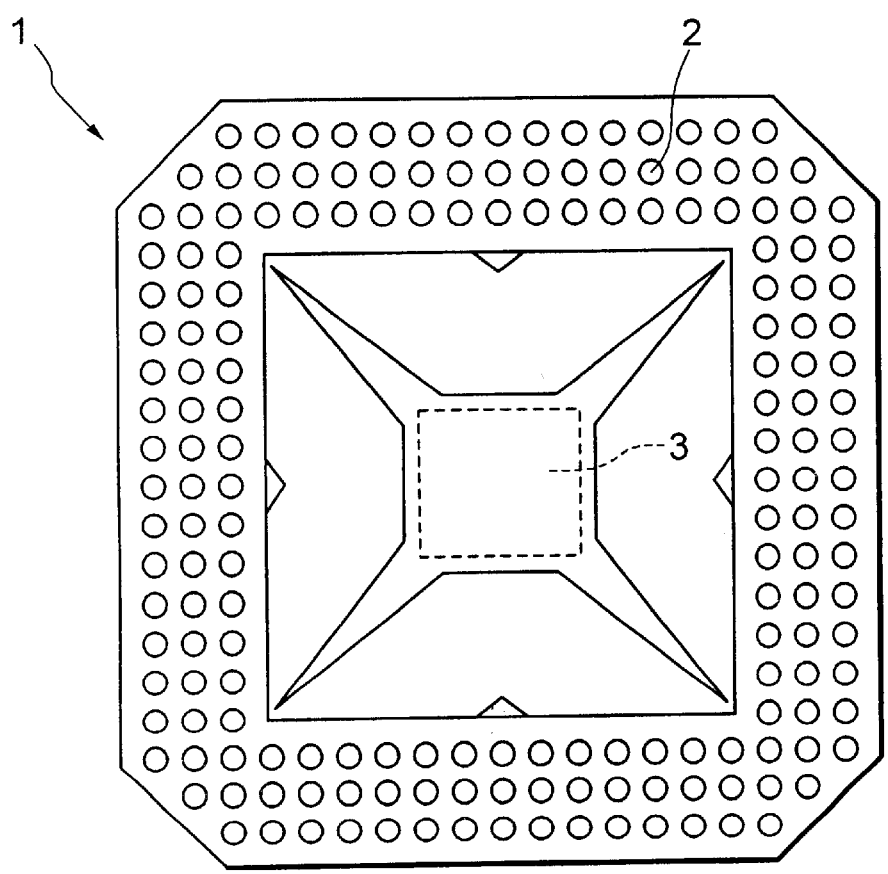
FIG. 1B is a plan view illustrating the BGA structure.
Figure 2A:
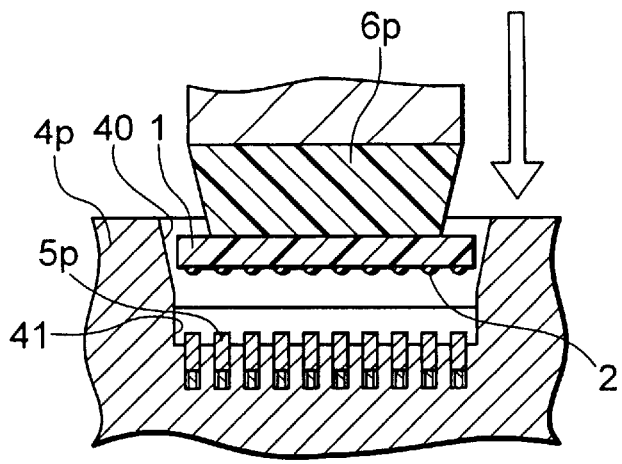
FIG. 2A through FIG. 2D are cross-sectional views showing a conventional method for measuring an IC package.
Figure 2B:
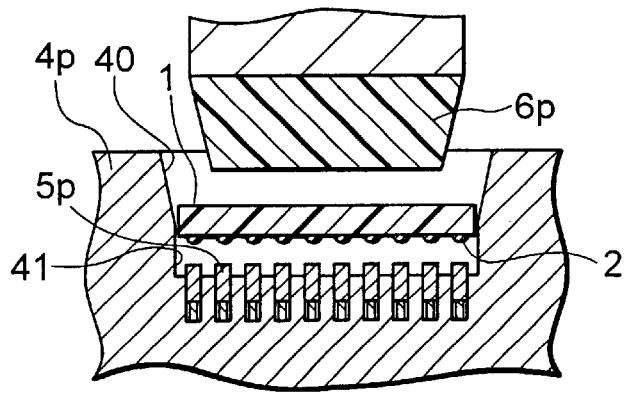
Figure 2C:
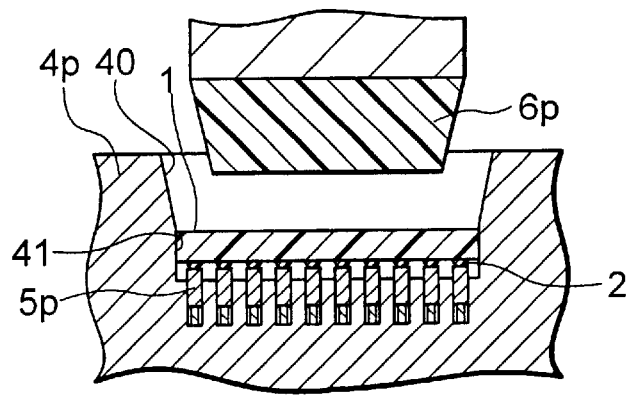
Figure 2D:
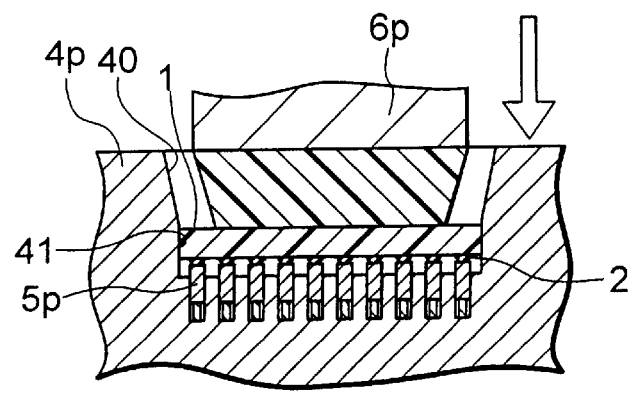
Figure 3A:
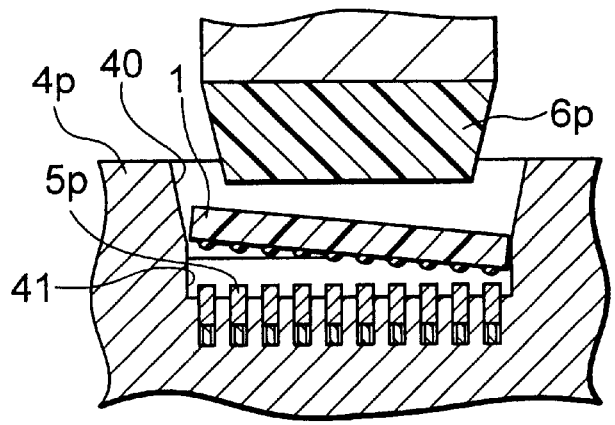
FIG. 3A and FIG. 3B are cross-sectional views showing a defective case occurring in the conventional method for measuring an IC package.
Figure 3B:
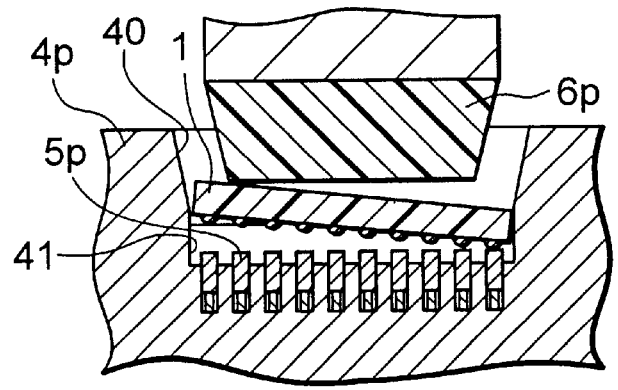
Figure 4A:
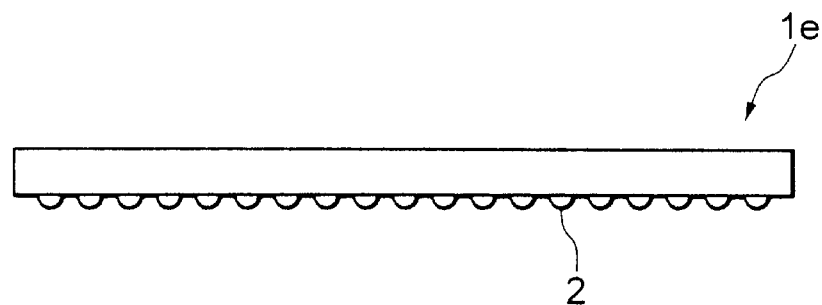
FIG. 4A is a side view illustrating a BGA structure in which the array of solder balls is misaligned.
Figure 4B:
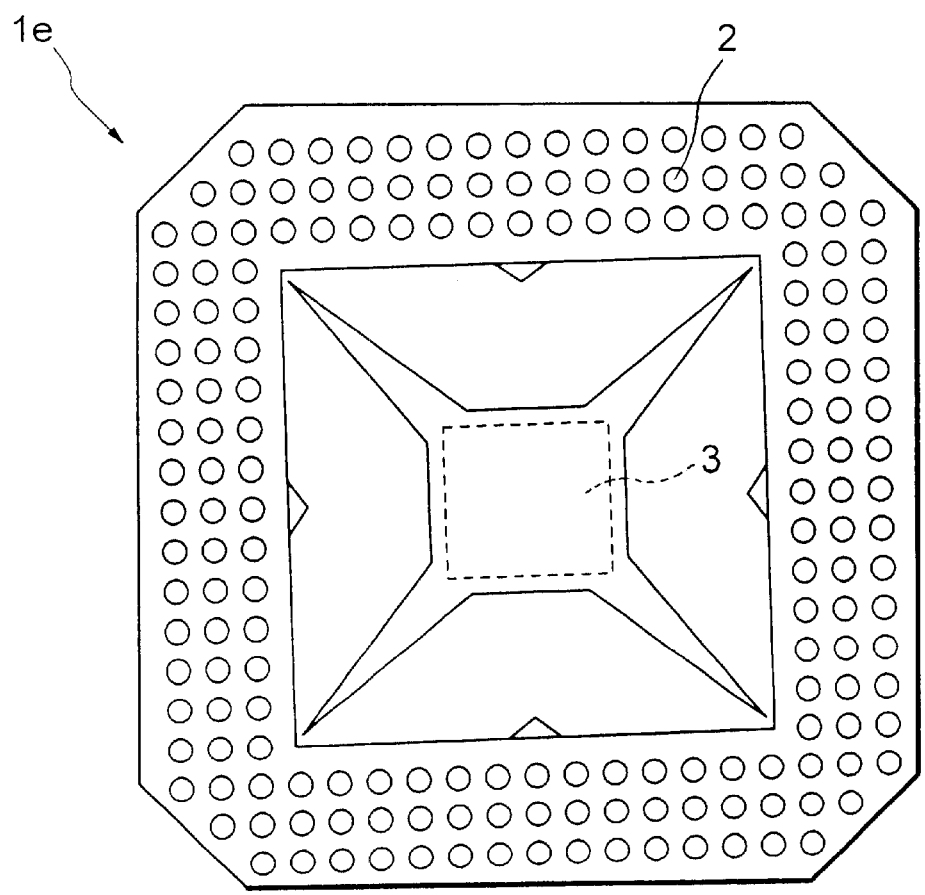
FIG. 4B is a plan view illustrating the BGA structure in which the array of solder balls is misaligned.

Next, the socket section 44 will be described. As shown in FIG. 5A, a socket 4a for securing the contact pins 5 and pilot pins 26 is provided in the socket section 44 and secured to a predetermined portion of the device. An opening 7 for receiving the contact pins 5 is provided in the center of the upper surface of the socket 4a. The opening 7 does not have a tapered portion as shown in FIG. 2A, and the sidewalls thereof are perpendicular to the bottom surface. The contact pins 5 which contact the solder balls 2 of the BGA 1 for measuring the electrical characteristics of the BGA 1 are disposed with their tips pointed upwardly at the bottom of the opening 7. The array pattern of the contact pins 5 is the same as that of the solder balls 2 of the BGA 1.

Two pilot pins 26 stand vertically on opposite sides of the opening 7 on the upper surface of the socket 4a. The pilot pins 26 fit into pilot holes 31 (FIG. 6) provided in the socket calibration jig 30 (FIG. 6) for recording the positional relationship between the socket 4a and the contact pins 5. In a plan view of the socket 4a as seen from above, the pilot pins 26 and the contact pins 5 have a fixed positional relationship. A wiring member such as a cable (not shown) for connecting each of the contact pins 5 to a measuring device (not shown) for measuring the electrical characteristics of the BGA 1 is connected to the lower side of the socket 4a.

Figure 6:
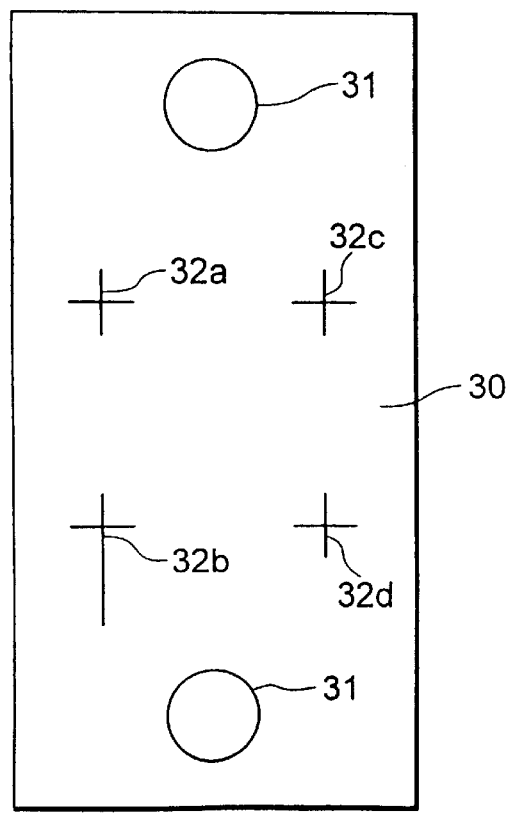
FIG. 6 is a plan view illustrating the structure of a socket calibration jig in the IC package testing device according to the first embodiment of the present invention.

Next, the socket calibration jig 30 will be described. FIG. 6 is a plan view showing the structure of the socket calibration jig 30. The socket calibration jig 30 is provided for recording the positional relationship between the socket 4a and the contact pins 5 in the socket section 44, and has a plate shape. The two pilot holes 31 are provided in the socket calibration jig 30, and the pilot pins 26 are fitted into the pilot holes 31, respectively. A difference between the inner diameter of each of the pilot holes 31 and the outer diameter of each of the pilot pins 26 is equal to or smaller than 0.01 mm. Four cross marks 32a to 32d are provided as image recognition marks on one surface of the socket calibration jig 30.

A method for testing an IC package using the IC package testing device of this embodiment will now be described. The testing procedure is generally divided into the preparation process, the alignment process, and the measurement process. The preparation process includes: fitting the pilot holes 31 of the calibration jig 30 around the pilot pins 26 using the pilot pins 26 and the calibration jig 30; sucking onto and holding the socket calibration jig 30 and then carrying it to the positioning section 43 by the suction head 6a; and recognizing the coordinates of the image recognition marks 32a to 32d of the socket calibration jig 30 in the positioning section 43 so that the array of the contact pins 5 in the socket 4a is stored. The alignment process includes: imaging and image-recognizing the array of the solder balls 2 of the BGA 1 while holding the BGA 1 by the chucks 20 in the positioning section 43 so as to store the coordinate data; and positioning the BGA 1 by the chucks 20 so that the BGA 1 is aligned with the array of the contact pins 5 which has been stored in the preparation process. The measurement process includes: sucking onto and holding the BGA 1 which has been positioned in the alignment process by the suction head 6a; inserting the BGA 1 into the socket 4a, thereby abutting the solder balls 2 on the contact pins 5; and measuring the electrical characteristics of the BGA 1.

Figure 7A:
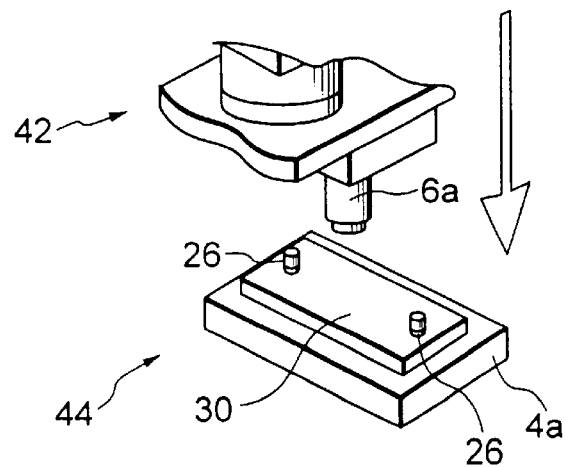
FIG. 7A is a perspective view showing a step in a preparation process of a method for testing an IC package according to the first embodiment of the present invention.
Figure 7B:
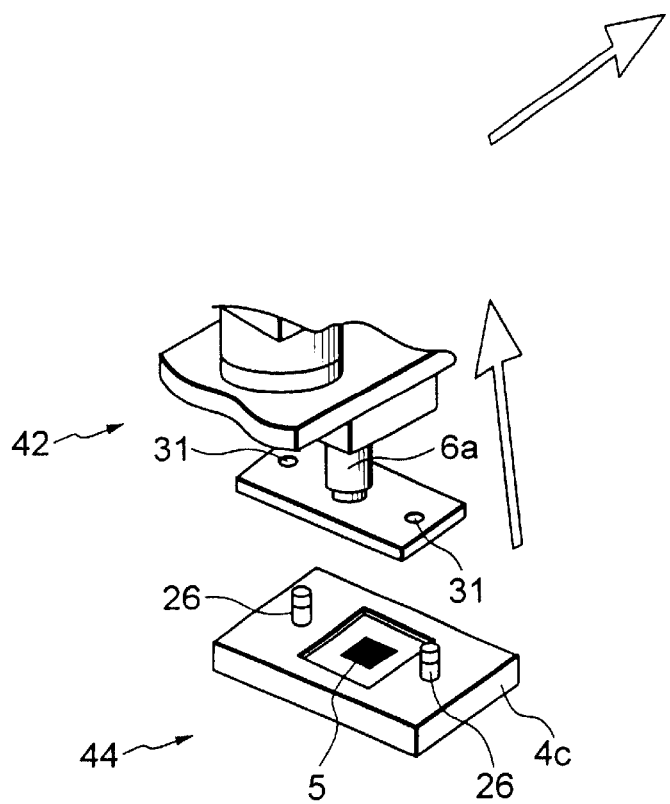
FIG. 7B is a perspective view showing the next step following the step shown in FIG. 7A in the preparation process of the method for testing an IC package according to the first embodiment of the present invention.
Figure 7C:
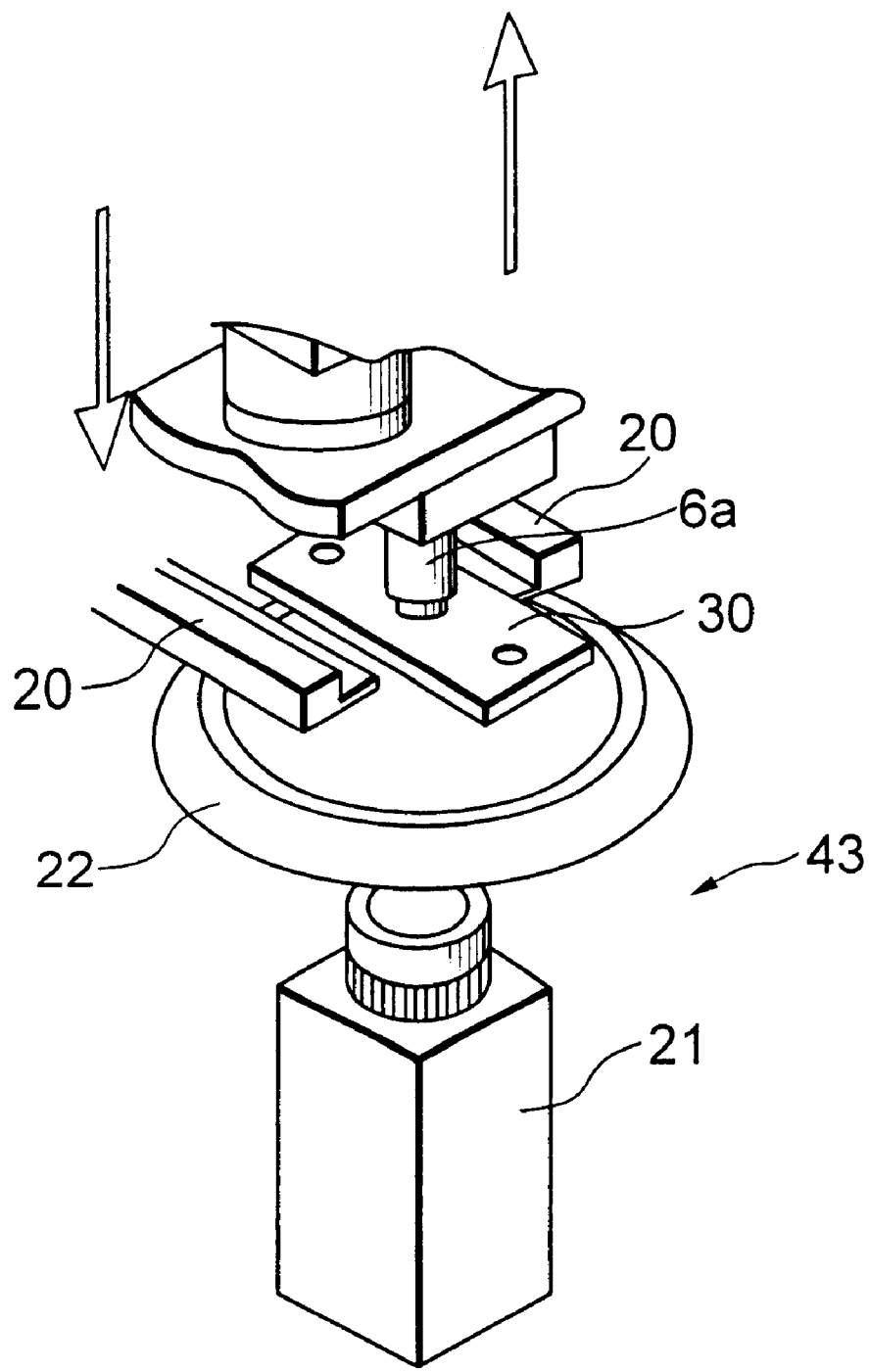
FIG. 7C is a perspective view showing the next step following the step shown in FIG. 7B in the preparation process of the method for testing an IC package according to the first embodiment of the present invention.

First, the preparation process will be described. FIG. 7A to FIG. 7C are perspective views showing steps of the preparation process according to the first embodiment of the present invention. First, as shown in FIG. 7A, the two pilot holes 31 are fitted around the pilot pins 26 of the socket 4a while the surface with the cross marks 32a to 32d (FIG. 6) of the socket calibration jig 30 is faced down, thereby mounting the socket calibration jig 30 onto the socket 4a. Then, since the difference between the inner diameter of each of the pilot holes 31 and the outer diameter of each of the pilot pins 26 is equal to or smaller than 0.01 mm, the fitting between the pilot holes 31 and the pilot pins 26 has substantially no looseness.

Next, as shown in FIG. 7B, the suction head 6a is carried to a fixed point A above the contact pins 5 using the carrier arm section 42. Thereafter, the suction head 6a is lowered to suck onto and hold the socket calibration jig 30, and is then raised. The fixed point A is a point in space above the group of the contact pins 5 at which the suction head 6a is positioned, such that the suction head 6a, when it is simply lowered without being moved in any other direction, would reach approximately the center of the group of the contact pins 5. It is desired that the center of the socket calibration jig 30 is positioned above the center of the group of the contact pins 5.

Next, as shown in FIG. 7C, the suction head 6a is moved while sucking onto the socket calibration jig 30, and lowered when it reaches a fixed point B above the camera 21. Then, the suction head 6a is stopped. If the chucks 20 would block the calibration jig 30 from coming down, the chucks 20 can be opened as shown in FIG. 7C. Thereafter, the camera 21 images and image-recognizes the lower surface of the socket calibration jig 30. The fixed point B is a point in space at which the suction head 6a is positioned, such that the suction head 6a, when it is simply lowered without being moved in any other direction, would reach approximately the center of the lens of the camera 21.

Figure 8:
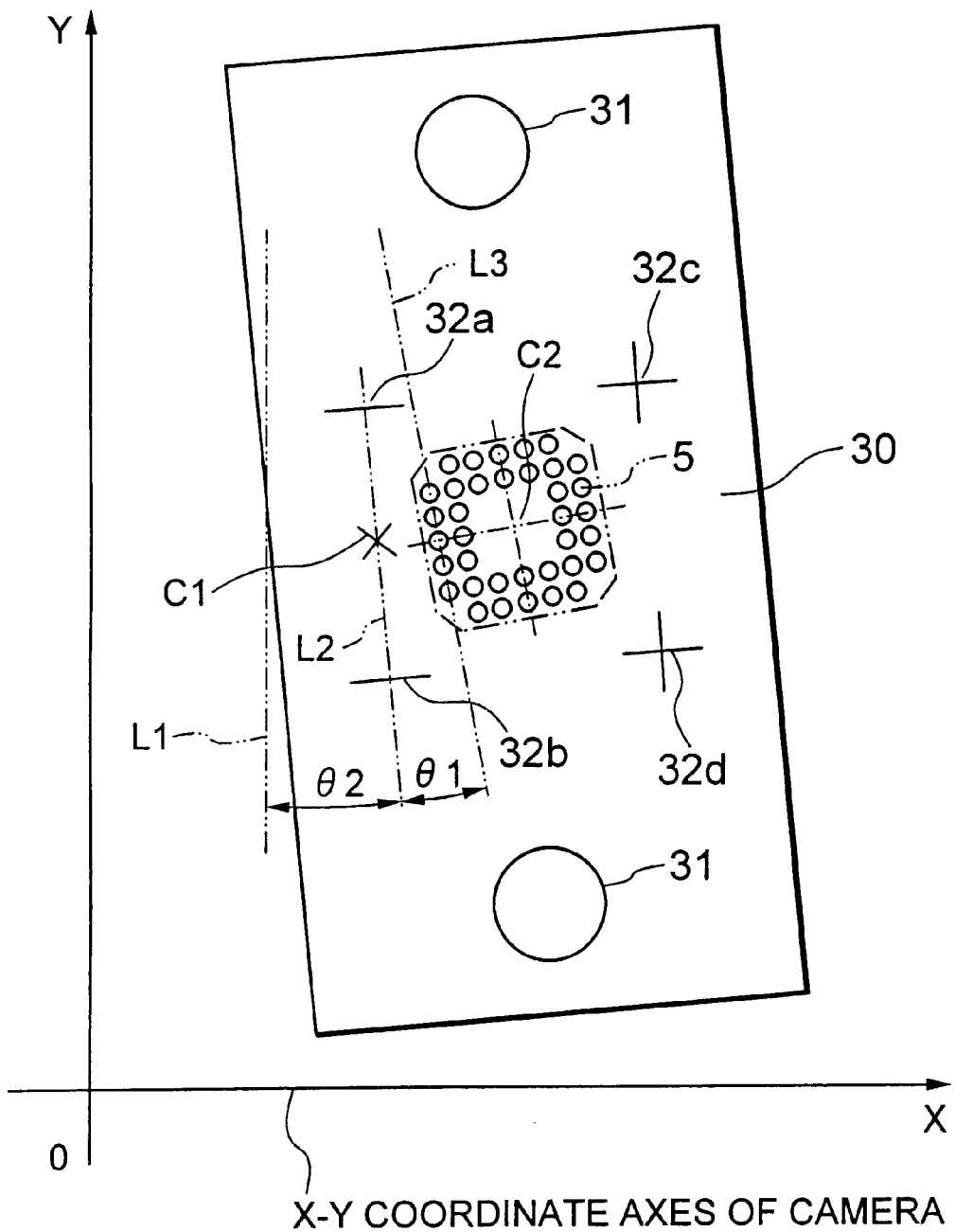
FIG. 8 is a plan view which shows the structure of the socket calibration jig in the IC package testing device according to the first embodiment of the present invention, and illustrates the array of contact pins which would be obtained if the center of each pilot hole is replaced by the center of each pilot pin.

FIG. 8 is a plan view showing the lower surface of the socket calibration jig 30, i.e., the surface to be imaged and image-recognized. With reference to FIG. 8, one embodiment of an image recognition method will be described. The cross marks 32a to 32d are provided on the lower surface of the socket calibration jig 30. In the socket calibration jig 30, these cross marks 32a to 32d have a fixed positional relationship with the pilot holes 31. Since the socket calibration jig 30 is fitted onto the socket 4a via the pilot pins 26 with substantially no looseness, as shown in FIG. 7A, the pilot holes 31 and the contact pins 5 in the socket 4a have a fixed positional relationship therebetween. Accordingly, in the socket calibration jig 30, the cross marks 32a to 32d have a fixed positional relationship with the contact pins 5.

For illustration purposes, FIG. 8 illustrates the array of the contact pins 5 (shown inside the two-dot-chain line in the center of the jig) which would be obtained if the center of each of the pilot holes 31 is replaced by the center of each of the pilot pins 26, although in reality, the contact pins 5 cannot be seen when the socket calibration jig 30 is image-recognized. The X-axis and the Y-axis shown in FIG. 8 are X-Y coordinate axes of the camera 21. In FIG. 8, for illustration purposes, a large level of inclination is intentionally provided among the X-Y coordinate axes, the columns of the cross marks 32a to 32d, and the columns of the contact pins 5.

The positional relationship between the cross marks 32a to 32d and the contact pins 5 has been known when the socket 4a was designed. In the case of FIG. 8, there exists an angular shift of θ1 between a line segment L2 which extends between the cross marks 32a and 32b, and a column L3 in the group of the contact pins 5 (i.e., one of straight lines which extend through the centers of the contact pins 5 is posed at the outermost periphery of the socket 4a ). Considering the line segment L2 and the midpoint C1 of the line segment L2 respectively as a Y2-axis and the origin of coordinates of the cross marks, the angle θ1 and a center position C2 of the group of the contact pins 5 in the above-described coordinate system are known.

By image-recognizing the socket calibration jig 30, an angle θ2 made by the Y-axis and the line segment L2, and X and Y coordinate values of the midpoint C1 of the line segment L2 in the X-Y coordinate axes of the camera 21 can be known. The angle θ2 and the coordinates of the midpoint C1 are data indicating the position of the socket calibration jig 30 in the socket section 44, i.e., data indicating the position of the socket 4a in the socket section 44. Since the angle θ1 made by the line segment L2 and the column L3, and the coordinate values of the center position C2 of the group of the contact pins 5 taken with the midpoint C1 as the origin of coordinates, are previously known, an angle (θ1+θ2) made by the column L3 and the Y-axis, and the X and Y coordinate values of the center position C2 of the group of the contact pins 5, in the X-Y coordinate axes of the camera 21 can be known by image recognition of the socket calibration jig 30.

Once these two elements are known, the position of each of the contact pins 5 on the X-Y coordinate axes of the camera 21 can be known since the contact pins 5 are arranged in a grid pattern with C2 as the center thereof. The position data is stored in the memory section. The pitch accuracy of the solder balls 2 is generally about ±0.05 mm, and an error due to the looseness in the fitting between each of the pilot holes 31 and each of the pilot pins 26 is ±0.01 mm or less even when the margin of the positioning accuracy in the positioning section 43 is taken into consideration. Thus, there is no problem in using the above-described position data as position data of each of the contact pins 5 in the socket 4a.

After completing the image recognition process and the storing process of the socket calibration jig 30 in the above-described manner, the suction head 6a moves away from the position above the camera 21 while sucking onto the socket calibration jig 30 as shown in FIG. 7C, and releases the socket calibration jig 30 at a predetermined position. Until the socket 4a is replaced by another for changing the product type to another, this process does not need to be performed again.

In the above-described process, the suction head 6a is moved by the carrier arm section 42. The operation of the carrier arm section 42 will now be described. The suction head 6a moves in the vertical direction as follows. First, the motor 14 as shown in FIG. 5A starts to rotate, thereby rotating the ball screw 11 along with the rotation of the motor 14. Along with the rotation of the ball screw 11, the vertical motion nut section 13 moves upwardly or downwardly along the rails 12, and the suction head 6a which is connected to the vertical motion nut section 13 via the load cell base plate 16, the load cells 17, and the connecting plate 18 moves upwardly or downwardly. The suction head 6a moves in the X-axis direction as follows. First, the ball screw 46 rotates, thereby moving the horizontal motion nut section 15 in the X-axis direction along the rails 47. Since the horizontal motion nut section 15 is connected to the C-shaped base plate 10 and the C-shaped base plate 10 is connected to the suction head 6a via the ball screw 11, the vertical motion nut section 13, the load cell base plate 16, the load cells 17, and the connecting plate 18, the suction head 6a moves in the X-axis direction.

Next, the alignment process for the BGA 1 will be described with reference to FIG. 5A. The suction head 6a sucks onto one of the BGAs 1 which have been arranged in predetermined positions, e.g., on a supply tray, and then carries the BGA 1 to the above-described fixed point B above the camera 21. The suction head 6a is lowered while the chucks 20 are opened, and then the chucks 20 are closed, thereby securing the BGA 1. As shown in FIG. 5A, the suction head 6a stops sucking onto the BGA 1 so as to release the BGA 1, and is then raised. Although a large upward stroke of the suction head 6a is shown in FIG. 5A for illustration purposes, this stroke may be smaller than this as long as the BGA 1 is away from the suction head 6a.

Next, the camera 21 images the array pattern of the solder balls 2, and the image recognition section (not shown) image-recognizes the array pattern of the solder balls 2 so as to obtain the array pattern of the solder balls 2 as coordinate data on the X-Y coordinate system of the camera 21. Then, the memory section (not shown) stores the array pattern. The array pattern of the solder balls 2 is obtained by obtaining the center of each of the solder balls 2 and then obtaining a straight line connecting these centers.

Next, as shown in FIG. 5B, the chucks 20 transfers the BGA 1 along the X-axis and the Y-axis, or rotates the BGA 1 in a horizontal plane, thereby aligning the aforementioned array pattern of the solder balls 2 with the array pattern of the contact pins 5 obtained in the preparation process. The alignment method is as follows. In the above-described preparation process, the memory section (not shown) stores the coordinates of the center position C2 of the group of the contact pins 5 on the X-Y coordinate system of the camera 21 and the angle ($\theta1+\theta2$) made by the column L3 in the outermost periphery of the group of the contact pins 5 and the Y-axis. These two elements are respectively aligned with the aforementioned center position of the group of the solder balls 2 stored in the process of image-recognizing the BGA 1 and the column forming the outermost periphery of the group of the solder balls 2.

The measurement process will now be described. First, as shown in FIG. 5A, the suction head 6a is lowered and sucks onto the BGA 1 after the alignment process. Next, the chucks 20 are opened, and the suction head 6a is then raised while sucking onto and holding the BGA 1. Thereafter, the suction head 6a moves in the X-axis direction, and stops when it reaches the fixed point A above the socket 4a.

The carrier arm section 42 and the socket section 44 shown in FIG. 5A are in this state. The fixed point A is the same as that when the socket calibration jig 30 is sucked in the above-described preparation process. The fixed point A is a point in space at which the suction head 6a is positioned, such that when the suction head 6a is simply lowered without being moved in any other direction, the center of the group of the solder balls 2 in the aligned BGA 1 would reach the center of the group of the contact pins 5 in the socket 4a.

Next, the suction head 6a is lowered so that the solder balls 2 are respectively abutted onto the contact pins 5. As described above, the carrier arm section 42 includes the load cells 17 which can measure a slight load in the vertical direction which is upwardly applied to the suction surface of the suction head 6a. By the lowering of the suction head 6a, the solder balls 2 abut on the respective contact pins 5, thereby compressing the contact pins 5. The load cells 17 can detect a slight load caused by such a compression of the contact pins 5. The load cells 17 convert the measured load to a voltage and output the voltage to the control section (not shown). The control section can rotate and stop the motor 14 based on the output signal. Specifically, when the output signal from the load cells 17 becomes equal to a preset voltage, the lowering of the suction head 6a can be stopped.

Thus, the condition such that the pressing pressure between the solder balls 2 and the contact pins 5 becomes minimum while the contact resistance therebetween is minimum is preset (i.e., the voltage such that the amount of compression of the contact pin 5 is minimum while the contact pin 5 abuts on the solder ball 2 after the oxide film on the surface of the solder ball 2 is torn by the contact pin 5 is preset). When the output signal from the load cells 17 becomes equal to the preset voltage, the lowering of the suction head 6a is stopped, and then the electrical characteristics of the BGA 1 may be measured. In doing so, it is always possible to measure the electrical characteristics of the BGA 1 under the optimal condition regardless of the variation in the thickness of the BGA 1. Then, there is no need to continuously detect the output signal of the load cells 17 and to continuously control the motor 14 while the step of lowering the suction head 6a is performed. Rather, in order to increase the operation speed, the suction head 6a can be unconditionally lowered at a high speed to a position where the BGA 1 would not abut on the contact pins 5, and then the control of the motor 14 can be performed.

After abutting the solder balls 2 of the BGA 1 on the respective contact pins 5 under such an optimal condition, thereby establishing an electrical connection therebetween, the measurement process for the electrical characteristics of the BGA 1 is performed.

In order to perform the entire measurement process of the BGA 1 at a high speed, it is preferable to increase the speed of movement of the carrier arm section 42 not only in the vertical movement but also in the horizontal movement from the positioning section 43 to the socket section 44. However, if only one load cell 17 is provided in the carrier arm section 42, since a load detecting section (the cylindrical portion) of the load cells 17 has a low rigidity, a vibration occurs in the load cell 17 when receiving a lateral external force. Since a distortion caused by such a vibration influences the measurement value of the load cell 17, an accurate measured load cannot be obtained until the vibration is attenuated to a certain level. More specifically, if the carrier arm section with one load cell horizontally moves at a high speed and then stops over the socket section 44, a vibration occurs in the load cell 17 due to the force of inertia and continues for a certain period of time. Since accurate load measurement cannot be performed by the load cell 17 until such a vibration is stopped, a waiting time is resulted between the time at which the carrier arm section stops its horizontal movement and the time at which the suction head 6a starts to be lowered.

Therefore, the testing device of this embodiment has two load cells 17 as shown in FIG. 5A. The two load cells 17 are provided on the lower surface of the load cell base plate 16, and the lower surfaces of the two load cells 17 are connected with the connecting plate 18. Thus, the vibration of the load cells 17 due to the force of inertia in the lateral direction can be suppressed to a large degree, and even immediately after the horizontally movable section 42b of the carrier arm section 42 is horizontally moved and then stopped, the vibration of the load cells 17 can be made so small that the measurement is not influenced by the vibration. Therefore, in the carrier arm section 42, even if the movable section 42d starts to be lowered immediately after the horizontally movable section 42b is horizontally moved and then stopped, accurate load measurement can be performed by the load cells 17.

The testing device shown in FIG. 5A includes one suction head 6a for the two load cells 17. In such a case, the suction head 6a may be disposed under the connecting plate 18 so that the axis center of the suction head 6a runs through the midpoint of a line segment connecting the axis centers of the two load cells 17. Accordingly, the load on the suction head 6a can be approximately equally divided and distributed to the two load cells 17 when the BGA 1 is abutted on the contact pins 5. Based on a measured load for one of the two load cells 17 or the sum of measured loads for both of the two load cells 17, the lowering and stopping of the suction head 6a may be controlled.

Effects of this embodiment of the present invention will now be described. According to the present embodiment, since the BGA 1 is abutted on the contact pins 5 while the suction head 6a sucks onto and holds the BGA 1, the BGA 1 will not be stuck in the side wall of the socket 4a. Moreover, since the coordinate data for the array pattern of the contact pins 5 and the coordinate data for the array pattern of the solder balls 2 are stored in advance, and the position of the BGA 1 is adjusted so that the contact pins 5 and the solder balls 2 accurately overlap each other in the socket 4a, the solder balls 2 of the BGA 1 abut on the respective contact pins 5 in the socket section in an aligned manner, thereby causing no damage to the solder balls 2 and the contact pins 5. Furthermore, since the solder balls 2 are abutted on the respective contact pins 5 while measuring a load applied to the BGA 1 by the load cells 17, the solder balls 2 can always be abutted on the respective contact pins 5 with an optimal load regardless of the thickness of the BGA 1, thereby making it possible to measure the electrical characteristics of the BGA 1 in a highly accurate manner. By horizontally disposing the two load cells 17, it is possible to suppress the vibration of the load cells 17 due to the force of inertia generated when the horizontally movable section 42b of the carrier arm section 42 moves in the horizontal direction and then stops. The movable section 42d also can be vertically moved immediately after the horizontal movement of the horizontally movable section 42b. Thus, it is possible to measure the electrical characteristics of the BGA 1 in an efficient manner.

Figure 9A:
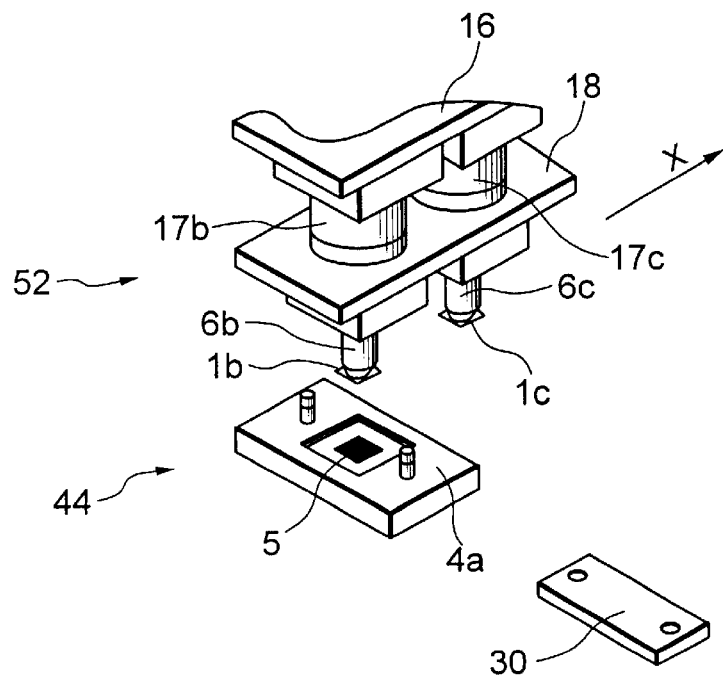
FIG. 9A is a perspective view illustrating the structure of a part of a carrier arm section and that of a socket section according to the second embodiment of the present invention.
Figure 9B:
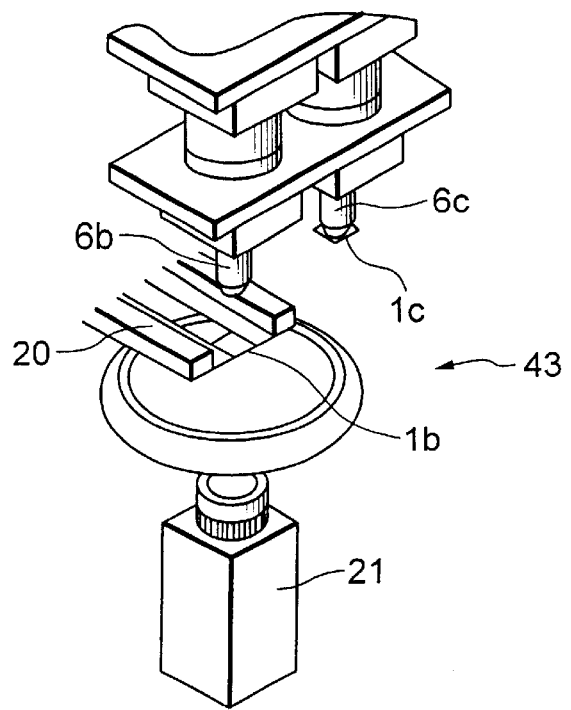
FIG. 9B is a perspective view illustrating the structure of the part of the carrier arm section and that of a positioning section according to the second embodiment of the present invention.

Next, the second embodiment of the present invention will be described. First, the structure of an IC package testing device of this embodiment will be described. FIG. 9A is a perspective view showing the structure of a part of a carrier arm section 52 and that of the socket section 44. FIG. 9B is a perspective view showing the structure of the part of the carrier arm section 52 and that of the positioning section 43. According to the structure of the IC package testing device of this embodiment, the carrier arm section 52 includes two load cells and two suction heads. The structures of parts of the IC package testing device of the second embodiment other than the suction heads are the same as those of the IC package testing device of the first embodiment.

As shown in FIG. 9A and FIG. 9B, according to the IC package testing device of the second embodiment of the present invention, the two load cells, i.e., load cells 17b and 17c, are horizontally disposed on the lower surface of the load cell base plate 16, and the connecting plate 18 is provided on the lower surfaces of the load cells 17b and 17c. The two suction heads, i.e., suction heads 6b and 6c are horizontally disposed on the lower surface of the connecting plate 18. The central axis of the suction head 6b in the vertical direction approximately coincides with the central axis of the load cell 17b in the vertical direction, and the central axis of the suction head 6c in the vertical direction approximately coincides with the central axis of the load cell 17c in the vertical direction. A line segment connecting the center of the suction head 6b and the center of the suction head 6c is parallel to the X-axis direction.

A method for testing an IC package using the IC package testing device of this embodiment will now be described. The measurements of the electrical characteristics of BGAs are sequentially performed by inserting BGAs 1b and 1c respectively sucked onto by the suction heads 6b and 6c into one socket 4a one at a time. Then, a load measurement value between the BGA 1b sucked onto by the suction head 6b and the contact pins 5 is mainly based on a measurement value in the load cell 17b. This is because although a slight load is detected upon abutting the BGA 1b on the contact pins 5 by the other load cell 17c which is connected via the connecting plate 18, the detected load is negligible.

Figure 10:
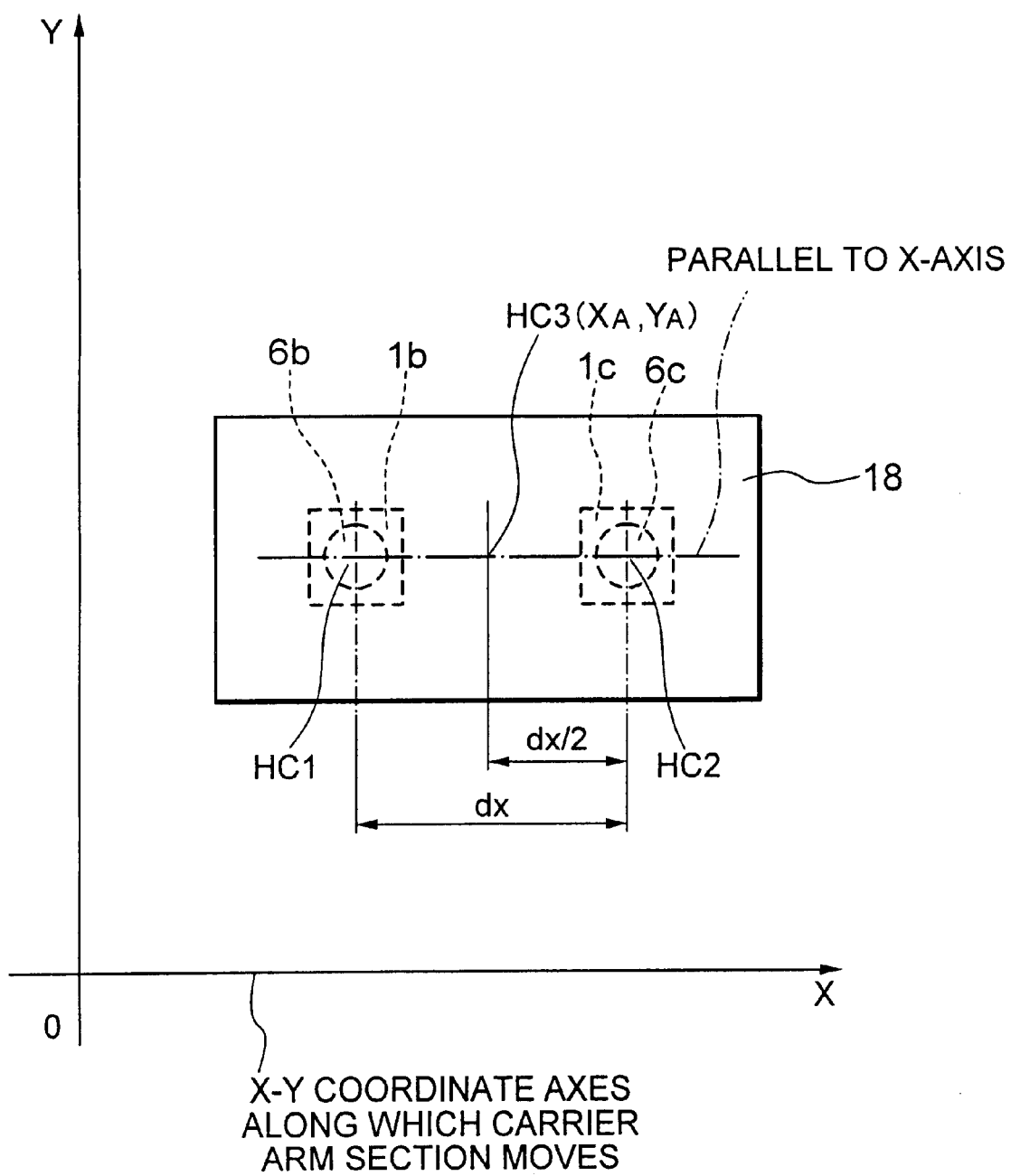
FIG. 10 is a plan view illustrating an arrangement of a connecting plate and suction heads in an IC package testing device according to the second embodiment of the present invention.

Upon the measurement, the carrier arm section 52 sequentially moves the suction heads 6b and 6c not only in the vertical direction but also in the X-axis direction so as to measure the electrical characteristics of each of the BGAs. FIG. 10 is a plan view showing the state of the connecting plate 18 and the suction heads 6b and 6c viewed from the lower surfaces thereof on the X-Y coordinate system in a horizontal plane. The X-axis direction is a direction in which the carrier arm section 52 can move.

In FIG. 10, a point HC1 is the center of the suction head 6b, and a point HC2 is the center of the suction head 6c. A line segment connecting the point HC1 and the point HC2 is parallel to the X-axis, and the distance between the point HC1 and the point HC2 is denoted by dx. The midpoint between the point HC1 and the point HC2 is denoted by a point HC3. The coordinates of the aforementioned fixed point A are denoted by $(X_A, Y_A)$.

The preparation process will now be described. First, the two pilot holes 31 are respectively fitted around the pilot pins 26 of the socket 4a while the surface with the cross marks 32a to 32d of the socket calibration jig 30 is faced down, thereby mounting the socket calibration jig 30 onto the socket 4a. Next, the carrier arm section 52 moves the suction head 6b so that the point HC3 corresponds to a point $(X_A+dx/2, Y_A)$ which is obtained by moving the fixed point A in the X-axis direction by a distance of dx/2. The suction head 6b is then lowered so as to suck onto and hold the socket calibration jig 30. The suction head 6b is raised and horizontally moved. The suction head 6b is lowered when the point HC3 reaches a fixed point above the camera 21, and then stopped. The coordinates of this fixed point are $(X_B+dx/2, Y_A)$ when the coordinates of the above-described fixed point B are $(X_B, Y_A)$. Next, the cross marks 32a to 32d of the socket calibration jig 30 are imaged and image-recognized by the camera 21 and the image recognition section (not shown), and the memory section (not shown) stores the coordinate data of the cross marks 32a to 32d. The image recognition method is the same as that shown in the first embodiment of the present invention.

Next, the alignment process will be described. As shown in FIG. 9B, the BGA 1b sucked onto by the suction head 6b and the BGA 1c sucked onto by the suction head 6c are delivered to the chucks 20 one at a time so as to perform the alignment. First, the suction heads 6b and 6c respectively sucking onto the BGAS 1b and 1c are carried by the carrier arm section 52, and stopped when the point HC3 coincides with the fixed point $(X_B+dX/2, Y_A)$. Next, the suction heads 6b and 6c are lowered, and the suction head 6b releases the BGA 1b at the chuck section, thus performing the alignment of the BGA 1b. Thereafter, the suction head 6b again sucks onto the BGA 1b. The suction heads 6b and 6c are raised and moved in the X-axis direction by a distance of (−dx), and stopped when the point HC3 coincides with a fixed point $(X_b \times dx/2, Y_A)$. Thereafter, the suction heads 6b and 6c are again lowered, and the suction head 6c releases the BGA 1c at the chuck section so as to perform the alignment of the BGA 1c. Then, the suction head 6c again sucks onto the BGA 1c, and the suction heads 6b and 6c are raised.

The measurement process will now be described. As shown in FIG. 9A, the suction heads 6b and 6c respectively suck onto the BGAs 1b and 1c after the alignment process, and are stopped when reaching a fixed point above the socket 4a. In the case where the BGA 1b sucked onto by the suction head 6b is measured first, this fixed point is a point obtained by moving the aforementioned fixed point A in the X-axis direction by a distance of dx/2, and the coordinates of the fixed point are $(X_A+dx/2, Y_A)$ Thereafter, the suction heads 6b and 6c are lowered so as to abut the solder balls 2 of the BGA 1b on the respective contact pins 5, thereby measuring the electrical characteristics of the BGA 1b. Next, the suction heads 6b and 6c are raised and moved in the X-axis direction by a distance of (−dx). Thereafter, the suction heads 6b and 6c are again lowered so as to measure the electrical characteristics of the BGA 1c sucked onto by the suction head 6c.

Effect of the second embodiment of the present invention will now be described. Unlike the testing device of the first embodiment of the present invention, it is possible to measure two BGAs in one test cycle according to the testing device of this embodiment. Therefore, the testing efficiency can be improved.

Figure 11A:
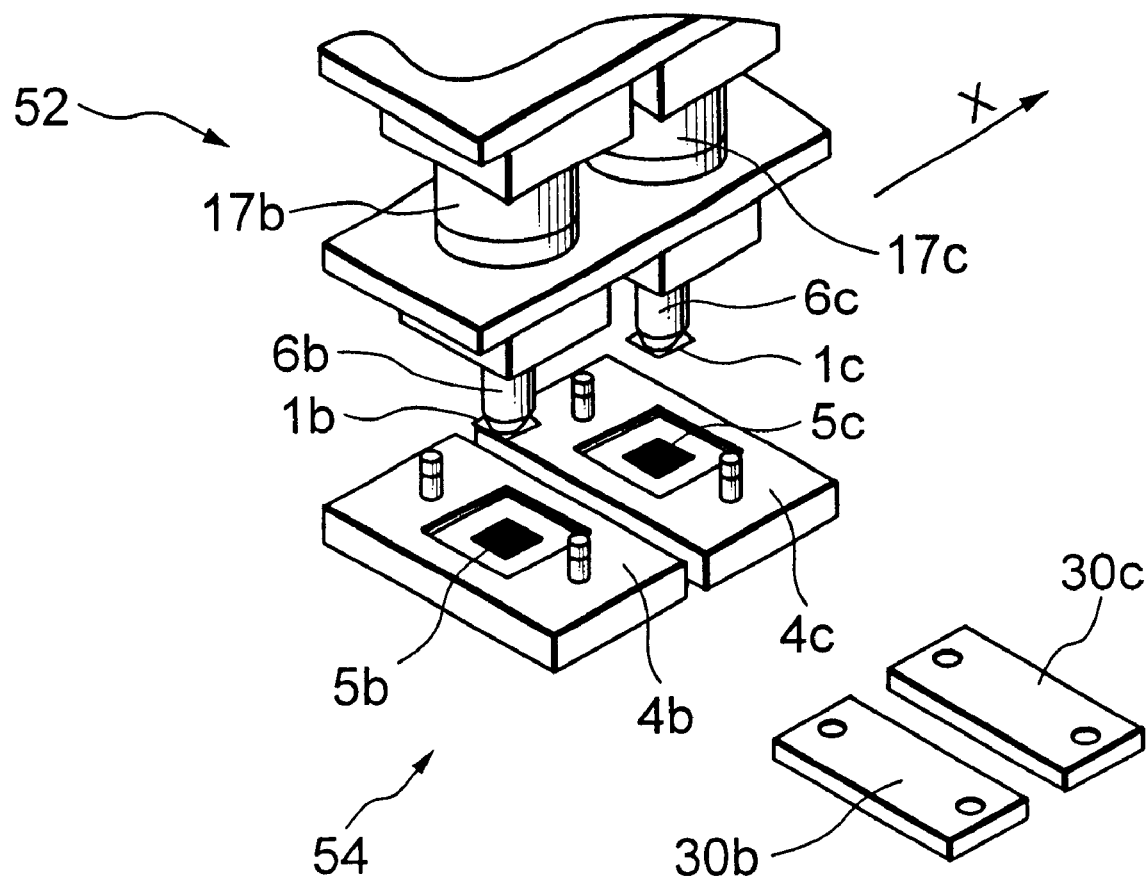
FIG. 11A is a perspective view illustrating the structure of a part of a carrier arm section and that of a socket section according to the third embodiment of the present invention.
Figure 11B:
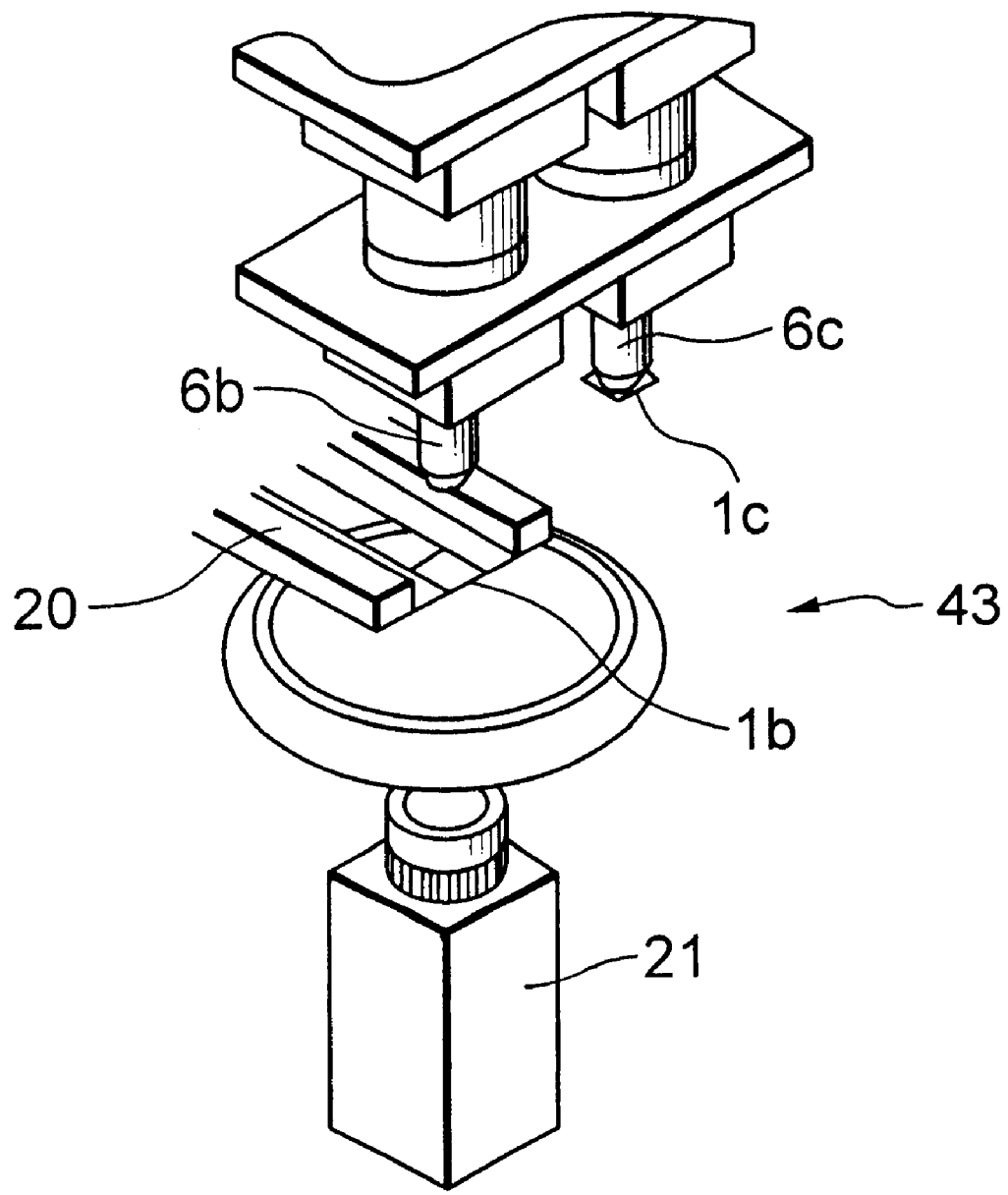
FIG. 11B is a perspective view illustrating the structure of the part of the carrier arm section and that of a positioning section according to the third embodiment of the present invention.

Next, the third embodiment of the present invention will be described. FIG. 11A is a perspective view showing the structure of a part of the carrier arm section 52 and that of a socket section 54 according to the third embodiment of the present invention. FIG. 11B is a perspective view showing the structure of the part of the carrier arm section 52 and that of the positioning section 43 according to the third embodiment of the present invention. Since an IC package testing device of this embodiment includes two suction heads in the carrier arm section 52 and two sockets in the socket section 54, it is possible to simultaneously measure the electrical characteristics of two BGAs. The structures of the carrier arm section 52 and the positioning section 43 in the testing device of the third embodiment are the same as those of the carrier arm section 52 and the positioning section 43 in the second embodiment. The state shown in FIG. 11A shows that two sockets 4b and 4c are disposed in the socket section 54 and two BGAs 1b and 1c are respectively sucked onto by the two suction heads 6b and 6c, i.e., a state just before starting the measurement of the electrical characteristics of the BGAs 1b and 1c. The central axis of the group of contact pins 5b in the socket 4b coincides with the central axis of the suction head 6b, and the central axis of the group of contact pins 5c in the socket 4c coincides with the central axis of the suction head 6c. The sockets 4b and 4c are disposed so that the tips of the contact pins 5b are on a level with the tips of the contact pins 5c, and the sockets 4b and 4c are secured to a predetermined position in the device. FIG. 11B shows a state such that the BGA 1b is being positioned by the chucks 20 in the positioning section 43.

Next, a method for testing an IC package using the IC package testing device of this embodiment will be described. First, the preparation process will be described. Using socket calibration jigs 30b and 30c, the array of the contact pins 5b in the socket 4b and the array of the contact pins 5c in the socket 4c are imaged and image-recognized by the camera 21 and the image recognition section (not shown). The thus-obtained coordinate data is stored in the memory section (not shown).

The preparation process will now be sequentially described. First, the array of the contact pins 5b in the socket 4b is measured. The position of the carrier arm section 52 shown in FIG. 11A is denoted by a fixed point α. The carrier arm section 52 is lowered from the fixed point α, sucks onto the socket calibration jig 30b fitted onto the socket 4b by the suction head 6b, and is then raised. The carrier arm section 52 is moved to the positioning section 43, lowered when the suction head 6b reaches a fixed point β above the camera 21 and then stopped. Next, the socket calibration jig 30b is imaged and image-recognized by the camera 21 and the image recognition section (not shown), and the position data of the contact pins 5b is stored. Thereafter, the carrier arm section 52 is raised. The fixed point β is a point in space at which the suction head 6b is positioned, such that the suction head 6b, when it is simply lowered without being moved in any other direction, would reach approximately the center of the lens of the camera 21.

Next, the array of the contact pins 5c in the socket 4c is measured. The carrier arm section 52 returns to the fixed point α, and is then lowered. After sucking onto the socket calibration jig 30c fitted onto the socket 4c by the suction head 6c, the carrier arm section 52 is raised and moved to the positioning section 43. Thereafter, when reaching a point obtained by moving the fixed point β in the X-axis direction by a distance of (−dx), the carrier arm section 52 is lowered and then stopped. Next, the socket calibration jig 30c is imaged and image-recognized by the camera 21 and the image recognition section (not shown), and the position data of the group of the contact pins 5c is stored.

Next, the process of aligning the BGAs 1b and 1c will be described. The alignment process is performed by sequentially delivering the BGAs 1b and 1c respectively sucked onto by the suction heads 6b and 6c to the chucks 20. First, after the carrier arm section 52 moves to the fixed point β, the carrier arm section 52 is lowered, thereby delivering the BGA 1b to the chucks 20. After aligning the position of the group of the solder balls 2 in the BGA 1b with the corresponding position of the array of the contact pins 5b in the socket 4b, the carrier arm section 52 receives the BGA 1b and is then raised. Thereafter, the carrier arm section 52 is moved in the X-axis direction by a distance of (−dx) from the fixed point β, and then lowered, thereby delivering the BGA 1c to the chucks 20. After aligning the position of the group of the solder balls 2 in the BGA 1c with the corresponding position of the array of the contact pins 5c in the socket 4c, the carrier arm section 52 receives the BGA 1c and is then raised. The position adjustment method by the chucks 20 according to the third embodiment of the present invention is the same as that in the first and second embodiments of the present invention.

Next, the measurement process will be described. The carrier arm section 52 is moved to the fixed point α, and then lowered so as to abut the solder balls 2 of the BGA 1b on the respective contact pins 5b in the socket 4b and to abut the solder balls 2 of the BGA 1c on the respective contact pins 5c in the socket 4c, thereby simultaneously measuring the electrical characteristics of the BGAs 1b and 1c.

However, points as follows should be noted in the present embodiment. Upon the measurement, the suction heads 6b and 6c are positioned at the same height. Accordingly, in order to ensure that the pressing pressures on the contact pins 5b and 5c are equal to each other and thus the contact resistance between the solder balls 2 and the contact pins 5b in the BGA 1b is equal to the contact resistance between the solder balls 2 and the contact pins 5c in the BGA 1c, the BGAs 1b and 1c need to have the same thickness in advance since the contact pins 5b and 5c are disposed so that the tips thereof are on the same level. This problem can be solved by employing BGAs of the same type and of the same manufacturing lot as the two BGAs 1b and 1c to be measured at the same time. Moreover, an optimal measured load can be determined in advance for every thickness of the BGA and stored in the control section (not shown) as a set value. Then, when the carrier arm section 52 is lowered while measuring a load by the load cells 17, the lowering of the carrier arm section 52 can be stopped as the measured load becomes equal to the stored set value. The set value may be selected by a selecting switch or the like provided in the control section (not shown) from among the stored set values according to the type and thickness of the BGA to be measured.

Next, effects of the IC package testing device of this embodiment will be described. Since the IC package testing device of the third embodiment of the present invention includes the two sockets, it is possible to simultaneously measure the electrical characteristics of two BGAs. Thus, the testing efficiency can be improved as compared to the IC package testing devices of the first and second embodiments of the present invention.

Although LEDs which are disposed in a ring shape so as to surround a BGA are used as an illumination device in the positioning section according to the embodiments of the present invention, the shape of the illumination device for the testing device of the present invention is not limited to a ring shape. As the shape of the illumination device, any optimal shape can be selected according to the type of BGA (e.g., a rectangular shape obtained by enlarging the outer shape of the BGA approximately in equal ratio) as long as the illumination device is capable of illuminating with a uniform illumination the entire area of the surface of the BGA on which the solder balls 2 are provided.

Although the carrier arm section is movable only in the vertical direction (Z-axis direction) and the X-axis direction in the embodiments of the present invention, the carrier arm section of the IC package testing device of the embodiments may be movable additionally in the Y-axis direction. Although such an IC package testing device may have a complicated mechanism and an increased manufacturing cost, such an IC package testing device has advantages as follows.

In an IC package testing device capable of moving in the Y-axis direction, a line segment connecting the axis centers of the two suction heads 6b and 6c does not necessarily need to be parallel to the X-axis. Thus, each of the suction heads can be disposed along any direction, whereby a plurality of sockets can be disposed with any positional relationship therebetween. Accordingly, the required accuracy of placement of the sockets can be reduced. In other words, since the need for adjusting the position of each of the sockets in a highly accurate manner is eliminated, each socket can be easily replaced with another. Moreover, it becomes possible to use two or more different kinds of contact pins in one IC package testing device. For example, a socket A including a group of contact pins of a type A and a socket B including a group of contact pins of a type B may be disposed along the Y-axis direction so that one of these types of contact pins can be selectively used according to the type of the BGA to be measured.

Figure 12:
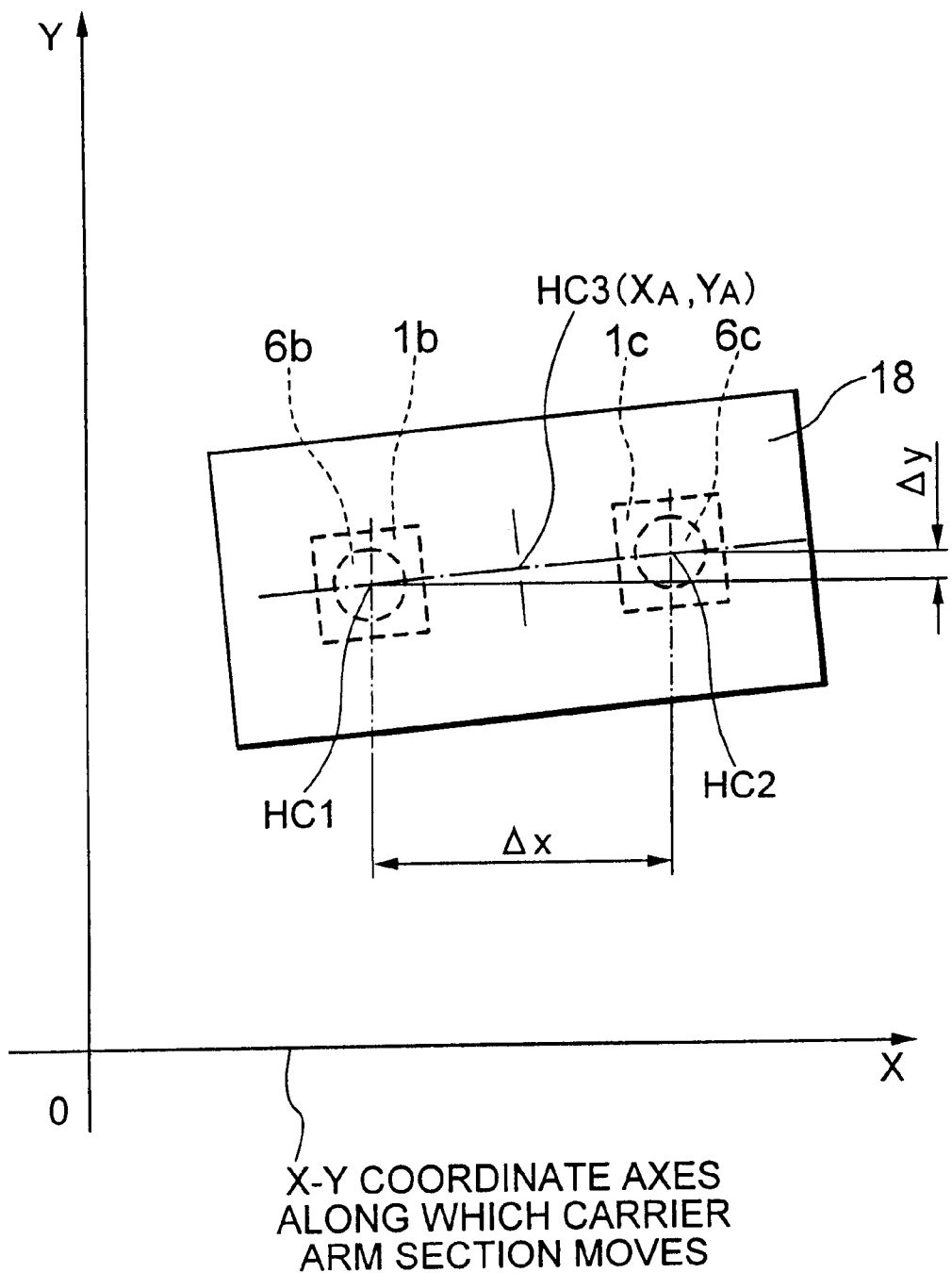
FIG. 12 is a plan view illustrating an arrangement of a connecting plate and suction heads in an IC package testing device.

FIG. 12 is a plan view showing the arrangement of the connecting plate 18 and the suction heads 6b and 6c in such an IC package testing device. In the IC package testing device, the coordinates of a point HC1 and the coordinates of a point HC2 are different from each other not only in the X component but also in the Y component, as shown in FIG. 12. In the case where the carrier arm section includes two load cells and two suction heads and there is one socket, a fixed point above the socket to which the suction head 6b moves in the measurement process is a point obtained by moving the aforementioned fixed point A by a distance of $\Delta x/2$ in the X-axis direction and a distance of $\Delta y/2$ in the Y-axis direction, i.e., point $(X_A+\Delta x/2, Y_A+\Delta y/2)$, where $\Delta x$ and $\Delta y$ respectively denote the X component difference and the Y component difference between the point HC1 and the point HC2. The carrier arm section is lowered starting from this point to measure the BGA 1b, after which the carrier arm section is raised and moved by a distance of $(-\Delta x)$ in the X-axis direction and by a distance of $(-\Delta y)$ in the Y-axis direction. Then, the carrier arm section is lowered so as to measure the electrical characteristics of the BGA 1c sucked onto by the suction head 6c. In the case where the two BGAs respectively sucked onto by the suction heads 6b and 6c are sequentially passed to the chucks 20 for aligning the solder balls 2 with the respective contact pins 5b and 5c in the alignment process, the suction heads 6b and 6c can be sequentially moved above the camera 21 as in the aforementioned measurement of the electrical characteristics of the two BGAs.

While there has been described what are at present considered to be preferred embodiments of the invention, it will be understood that various modifications may be made thereto, and it is intended that the appended claims cover all such modifications as fall within the true spirit and scope of the invention.

The camera 21 images both the solder balls and the contact pins in the above-described embodiments. However, the contact pins may be imaged by another camera which is different from the camera 21 which images the solder balls. Also, an image recognition unit for the contact pins may be different from an image recognition unit for the solder balls.

What is claimed is:

1. An IC package testing device, comprising:

a measuring unit having a socket including contact pins to contact with solder balls in an IC package for measuring electrical characteristics of the IC package, said measuring unit located at a first location;

a camera unit located at a second location for imaging a positional pattern of the solder balls in the IC package;

an image recognition unit which recognizes an image obtained by the camera unit, processes the image, and obtains a positional pattern data of the solder balls;

a first memory unit for storing the pattern data of the solder balls;

a second memory unit for storing a positional pattern data of the contact pins in the socket, as provided by a preparation (calibration) process to translate said positional pattern data of the contact pins located at said first location relative to said second location;

an adjusting unit for adjusting a position of the IC package so as to align the positional pattern of the solder balls with the positional pattern of the contact pins at a positioning section located at said second location; and a carrier unit for holding the IC package which has been adjusted the position thereof at the positioning section, and carrying it from said second location to the socket at said first location and contacting the solder balls on the contact pins.

2. The IC package testing device according to claim 1, further comprising:

a plurality of pilot pins which are provided in the socket and have a fixed positional relationship with the contact pins; and a socket calibration jig including a plurality of pilot holes which are fitted around the pilot pins and a plurality of image recognition marks which have a fixed positional relationship with the pilot holes, wherein said camera unit images the image recognition marks, said image recognition unit recognizes an image of the image recognition marks, processes the image, and obtains a positional data of the image recognition marks and thereby obtains the positional pattern data of the contact pins, and said second memory unit stores the positional pattern data of the contact pins.

3. The IC package testing device according to claim 1, wherein said adjusting unit includes a chuck unit which moves the IC package along an X-axis and a Y-axis and rotates the IC package in a horizontal plane formed by said X-axis and said Y-axis.

4. The IC package testing device according to claim 2, wherein a difference between an inner diameter of each of the pilot holes and an outer diameter of each of the pilot pins is equal to or less than 0.01 mm.

5. The IC package testing device according to claim 1, wherein a unit for holding the IC package in the carrier unit comprises a suction device.

6. The IC package testing device according to claim 1, wherein the carrier unit comprises:
   a motor for raising and lowering the IC package; and
   a load cell for measuring a load on the IC package,
   wherein an operation of the motor is controlled in association with the load on the IC package which is measured by the load cell.

7. The IC package testing device according to claim 1, further comprising a plurality of load cells which sense a force which said solder balls contact said contact pins.

8. A method for testing an IC package on a test apparatus having a socket located at a first position, said socket having contact pins corresponding to solder balls in said IC package, said method comprising:
   imaging and recognizing a positional pattern of the solder balls in the IC package by a camera section located at a second position;
   storing said positional pattern data of the solder balls in the IC package;
   storing a positional pattern data of the contact pins in the socket, as provided by a preparation (calibration) process to translate said positional pattern data of the contact pins located at said first position relative to said second position;
   adjusting a position of the IC package so as to align the positional pattern of the solder balls with the positional pattern of the contact pins;
   carrying the IC package to the socket located at said first position and contacting the solder balls to the contact pins; and
   measuring electrical characteristics of the IC package after contacting the solder balls on the contact pins.

9. The method for testing an IC package according to claim 8, further comprising:
   fitting pilot holes of a socket calibration jig around pilot pins provided around the socket and have a fixed positional relationship with the contact pins;
   pulling out a socket calibration jig from the pilot pins while holding the socket calibration jig by the carrier unit;
   imaging recognition marks on said calibration jig by said camera section; and
   image-recognizing an image of said image recognition marks obtained by said camera section and obtaining a positional pattern data of the image recognition marks, thereby obtaining and storing the positional pattern data of the contact pins.

10. The method for testing an IC package according to claim 8, further comprising:
    measuring a load applied to the IC package by a load cell, wherein said contacting the solder balls on the contact pins comprises contacting the solder balls on the contact pins while controlling the load applied to the IC package as based on the load.

11. An apparatus to test an integrated circuit (IC) package containing an IC circuit and a pattern of solder balls to interface said IC circuit to an external circuit, said apparatus comprising:
    a socket containing contact pins which correspond to a set of solder balls on an IC package undergoing testing;
    a measurement unit to measure at least one characteristic of said circuit when said IC package undergoing testing is fitted into said socket to bring contact pins of said IC package undergoing testing into contact with said contact pins of said socket;
    a memory containing a positional data of said contact pins of said socket, said positional data obtained by a calibration process; and
    an adjuster to align a position of said IC package undergoing testing so that the pattern of solder balls on said IC package undergoing testing aligns to said calibration positional data.

12. The apparatus of claim 11, further comprising:
    a calibration jig placed at a predetermined orientation relative to said contact pins of said socket, said calibration jig having a set of recognition marks on a surface; and
    an image processor for determining a position of said alignment marks, thereby determining a position of said contact pins of said socket.

13. The apparatus of claim 11, wherein said adjuster comprises:
    a camera to provide an image of said solder balls on said IC package undergoing testing;
    an image processor to calculate a position of said solder ball pattern based on said image; and
    a mechanism to move said IC package undergoing testing in an X-axis and a Y-axis and to rotate said IC package.

14. The apparatus of claim 11, further comprising at least one load cell used to control an amount of force that said solder balls exert on said contact pins.

15. The apparatus of claim 13, wherein said calibration positional data is additionally provided by said camera and said image processor, wherein said camera provides an image of a calibration jig placed at a predetermined location relative to said contact pins of said socket to said image processor, said image including a set of recognition marks on said calibration jig to allow said image processor to calculate said calibration positional data.

16. The apparatus of claim 13, wherein said camera and said socket are located in two separate locations.

17. The apparatus of claim 15, wherein said predetermined location of said calibration jig relative to said contact pins is provided by a plurality of pilot pins on said calibration jig and a corresponding plurality of pilot holes located around said socket.

18. A method of testing an IC package containing an IC circuit and a pattern of solder balls to interface said IC circuit to an external circuit, said method comprising:
    placing a calibration jig in a predetermined orientation relative to a socket containing contact pins corresponding to a pattern of solder balls on an IC package undergoing testing, said calibration jig containing a set of recognition marks located in a predetermined orientation relative to said contact pins of said socket;
    inputting, into an image processor, an image of said calibration jig placed at said predetermined orientation;
    calculating a calibration positional data of said contact pins based on said image of said calibration jig;
    inputting, into an image processor, an image of a pattern of solder balls of an IC package undergoing testing;

calculating from said image of said IC package undergoing testing a current orientation of said IC package undergoing testing and a correction needed to align said current orientation with said calibration positional data;

reorienting said IC package undergoing testing according to said correction;

moving said IC package undergoing testing into said socket; and taking at least one measurement for said IC package undergoing testing.

19. The method of claim 18, further comprising:

measuring a force that said solder balls exert on said contact pins by at least one load cell; and using said force measurement as a control in said moving said IC package undergoing testing into said socket.

20. The method of claim 24, wherein said placing of said calibration jig is confined by a plurality of pilot pins on said calibration jig and a corresponding set of pilot holes located around a periphery of said socket.

* * * * *